(12) United States Patent
Pastine et al.

(10) Patent No.: US 11,926,736 B1
(45) Date of Patent: Mar. 12, 2024

(54) CURABLE FILM COMPOSITION, CURABLE FILM, AND CURED PRODUCT THEREOF

(71) Applicant: Thintronics, Inc., Berkeley, CA (US)

(72) Inventors: Stefan J. Pastine, Berkeley, CA (US); Yaroslav Klichko, Oakland, CA (US)

(73) Assignee: Thintronics, Inc., Berkeley, CA (US)

( * ) Notice: Subject to any disclaimer, the term of this patent is extended or adjusted under 35 U.S.C. 154(b) by 0 days.

(21) Appl. No.: 18/110,949

(22) Filed: Feb. 17, 2023

(51) Int. Cl.
*C08L 9/00* (2006.01)
*C08J 3/28* (2006.01)
*C08K 7/28* (2006.01)
*H05K 1/03* (2006.01)

(52) U.S. Cl.
CPC . *C08L 9/00* (2013.01); *C08J 3/28* (2013.01); *C08K 7/28* (2013.01); *H05K 1/0373* (2013.01); *C08J 2309/00* (2013.01); *C08J 2471/02* (2013.01); *C08L 2203/16* (2013.01); *C08L 2203/20* (2013.01)

(58) Field of Classification Search
CPC ..... C08L 9/00; C08L 2203/16; C08J 2309/00; C08J 2471/02; C08K 7/28
See application file for complete search history.

(56) References Cited

U.S. PATENT DOCUMENTS

| | | |
|---|---|---|
| 3,699,050 A | 10/1972 | Henderson |
| 4,592,885 A | 6/1986 | Ichino |
| 4,904,293 A | 2/1990 | Garnier |
| 4,924,005 A | 5/1990 | Dahms |
| 5,310,820 A | 5/1994 | Nelissen |
| 6,805,958 B2 | 10/2004 | Nakamura |
| 7,172,713 B2 | 2/2007 | Arai |
| 7,541,408 B2 | 6/2009 | Ohno |
| 8,187,696 B2 | 5/2012 | Paul |
| 9,258,892 B2 | 2/2016 | Crosley |
| 9,265,160 B2 | 2/2016 | Paul |
| 10,822,527 B2 | 11/2020 | Tochihira |
| 11,066,520 B2 | 7/2021 | Hsieh |
| 11,359,062 B1 | 6/2022 | Amla |
| 11,596,066 B1 | 2/2023 | Amla |
| 2005/0133953 A1 | 6/2005 | Yamazaki |
| 2009/0050842 A1 | 2/2009 | Shelby |
| 2009/0054638 A1 | 2/2009 | Shelby |
| 2009/0096962 A1 | 4/2009 | Shelton |
| 2010/0055356 A1 | 3/2010 | Takeda |

*Primary Examiner* — Edward J Cain
(74) *Attorney, Agent, or Firm* — Element IP, PLC

(57) ABSTRACT

A curable film and a cured product obtained by curing the curable film are disclosed. The curable film contains, as essential components, hollow glass microspheres and a rubber composition containing at least one diene-based rubber. The curable film is thin and has excellent processibilities. The cured product has desirable dielectric and thermomechanical characteristics that are suitable to be used as a dielectric material for printed circuit boards, especially for multilayer printed circuit boards and high-density interconnect printed circuit boards.

21 Claims, 8 Drawing Sheets

CURABLE FILM COMPOSITION, CURABLE FILM, AND CURED PRODUCT THEREOF

BACKGROUND

Technical Field

The present invention relates to a composition for curable films; a curable film made thereof, a cured product obtained by curing the curable film; and a method for making the curable film. The curable film is thin and has substantially light weight and excellent processibilities. The cured product thereof has desirable dielectric characteristics and thermomechanical properties suitable as, for example, a circuit material for making printed circuit boards (PCBs). The curable film thus can be used to replace prepregs with advantageous results. The present invention also relates to PCB dielectric layers made from the curable film, especially for multilayer PCBs and HDI PCBs.

Description of the Related Art

The necessity for supporting high data rates for, for example, high speed computers, and the demand for small and/or lightweight electronic devices, such as mobile devices, IoT devices, autonomous systems (LiDAR, radar, and cameras) for self-driving cars and drones, and electronic components for medical equipment and military communication equipment, 5G applications, and the like, have led to the exploration of new insulators for circuit materials.

Printed circuit boards (PCBs) are used in nearly all electronic products nowadays. A basic PCB includes a flat sheet of insulating material (dielectric layer) and a layer of copper foil laminated to the substrate. PCBs can be single sided (one copper layer), double sided (two copper layers), or multilayer that allow high component density. Multilayer PCBs, which became more frequent in the 1990s, are complex composite structures typically comprising a series of layers of reinforced resin and copper foil. Conductors on different layers may be connected with "vias" or plated-through holes. High-density interconnect (HDI) technology allows for even denser designs in a given area on PCBs. Multilayer HDI PCBs not only are more compact, but also have lower layer count, lighter weight, and smaller vias, pads, copper traces, and spaces. In addition, by shortening the distance between devices and trace spaces, HDI PCBs allow for more transistors for better performance in electronics while lowering power consumption. Signal integrity is also improved due to the shorter distance connections and lower power requirements. As a result, more compact and smaller PCBs with improved performance become possible.

There are three common HDI structures. The first structure is a 1+n+1 structure, which has one layer built up on either side of a core assembly containing n layers. Typically, the lowest value of n is 2. The second structure is an i+n+i structure, where i is greater than or equal to 2. This means a build of i layers, where i is greater than or equal to 2, on either side of an n-layered core assembly. An exemplified i+n+i HDI PCB, where the middle is a glass reinforced core of 6 (i.e., n=6) layers and the external 4 (i.e., i=4) layers are glass reinforced prepreg-based layers, is illustrated in FIG. 1A. The third is any-layer HDI PCB, in which all layers can be interconnected using copper filled vias. The any-layer HDI PCBs are commonly used in mobile devices. An exemplified any-layer HDI PCB configuration, where the middle core is a double-sided glass reinforced laminate and the external layers are glass reinforced prepreg-based layers, is illustrate in FIG. 1B.

Driven by ever-increasing demand for miniaturization of components, mobile computing, and 5G applications, HDI PCBs utilize the latest technology to further reduce the area while increasing the functionality of the circuit boards. HDI PCBs are now widely used in applications that require smaller sized circuit boards, such as cellular phones, touchscreen devices, laptop computers, digital cameras, 5G network communications, autonomous systems in automotive and aerospace industries, medical devices, and military applications such as avionics and smart munitions. To conserve space, HDI PCBs require the use of thin layers of dielectric materials at little cost of the desirable thermomechanical and electrical properties.

The PCB manufacturing processes that join the conducting and insulating materials require thermal excursions between temperature range as large as 250-300° C. The introduction of interconnecting conductors including vias or micro-vias also requires specific processes that are thermomechanically challenging. Almost all PCBs require the conducting layers to be made from copper metal conducting sheets and traces. This introduces strict requirements on the properties of the dielectric base materials that can be employed to produce PCBs containing copper conducting elements. Because the conducting copper materials and the dielectric materials can have dissimilar thermomechanical properties, the manufacture of PCBs has rigid requirements on the thermomechanical properties of constituent materials considered to be suitable for use as dielectric base materials. Thus, only a small class of dielectric base materials having specific thermomechanical properties are possible to be used in manufacturing PCBs. If the materials for use in the dielectric layers do not fall within the accepted range of thermomechanical properties that are compatible with copper conducting layers, failure of the PCB occurs. The selection of dielectric materials with acceptable thermomechanical properties is thus an important factor to consider in the field of PCB material design. The conventional need to match the thermomechanical properties of copper has led to the prioritization of thermomechanical design rules at the expense of optimized electrical properties in dielectric base materials. Generally speaking, suitable dielectric materials must have low propensity to expand when heated and must be relatively rigid when subjected to mechanical forces. It is believed that these properties of low thermal expansion and high stiffness prevent excessive motion relative to the copper conductor layers during processing and prevent excessive strain placed on the interconnects during the PCB cycle life. However, the limits placed on the range of acceptable thermomechanical properties required for compatibility with copper conducting layers have limited the development of novel dielectric materials with optimized electrical properties that can be accommodated into existing PCB designs.

Most dielectric materials used to make PCBs incorporate fiber reinforcements into a thermosetting resin system. Reinforcement usually takes the form of woven or nonwoven fiberglass. Prepreg is a term of art used to describe a woven or nonwoven fabric that has been impregnated with a thermosetting resin composition. The terms A-stage, B-stage, and C-stage are used to describe a prepreg in the uncured, partially cured, and fully cured state, respectively. Prepregs are the workhorse of the PCB industry, and there are numerous types of fiberglass cloths used to make prepregs for PCB base materials, varying in glass weave style, thickness, and dielectric constant. Although the vast majority of prepreg PCB base materials use fiberglass, other fiber reinforcements may be used. A-stage or B-stage prepregs may be stacked to meet a required thickness, and a metal foil, such as a copper foil, is stacked on one or both sides. The obtained assembly is then heated and pressed (often referred to as lamination) to from a metal-clad laminate (e.g., single-clad or double-clad). During the lamination process, the thermosetting resin composition of the prepreg bonds to the metal foil and cures, forming an insulating layer clad with copper. The C-staged prepreg or laminate is commonly referred to in the art as "core". Core may be single-clad, or double clad with copper, and the copper may be etched to form patterns for circuitry.

The conventional PCB fabrication process typically entails building multilayer PCBs in a single lamination process whereby cores and prepregs are stacked in alternating fashion. This contrasts with the HDI PCB fabrication process where layers are added sequentially, i.e., a build-up process, and require a new lamination cycle for each build-up. Prepregs are conventionally used for the build-up layers.

Typical thermosetting resins include epoxy resins, polyester resins, cyanate ester resins, phenol formaldehyde resins, BT resin, polyphenylene ether resin, and hybrids thereof. Additives, such as flame retardants, curing agents, fillers, ultraviolet absorbers, coupling agents, tougheners, tack modifiers, antioxidants, and thixotropic agents, can be introduced into the resin system to adjust the dielectric and physical properties of the polymeric dielectric composite material. Generally, premium products in the industry try to balance the best electrical properties and lowest expansion but this can lead to fabrication related problems such as brittleness and reliability issues.

As a conventional cured prepreg is a composite formed with fiberglass, it is heterogeneous and anisotropic. A number of properties, such as dielectric properties, coefficients of thermal expansion (CTE), and Young's modulus (also known as tensile modulus) in the x, y, and z directions, are affected. The issue of anisotropy and non-uniform dielectric properties cause "skew" in PCBs. Mechanical processes, such as drilling (either mechanical or laser) and debris removal from holes, are difficult. Problems, such as excessive heat buildup, lower productivity, and lower reliability, are also identified. Additionally, the glass fabric thickness is a barrier towards achieving 25 µm and lower in dielectric layer thickness for PCBs, thereby hindering the process of miniaturization. The lack of availability of thin fiberglass combined with its relatively high dielectric constant is a particular issue for continued PCB miniaturization.

Particulate mineral or ceramic fillers can be added to prepreg composition to adjust the dielectric and physical properties. Hollow glass microspheres are particularly used to lower the dielectric constant. Before use, the glass spheres are usually subjected to surface treatments to enhance the wettability of the spheres by the polymer matrix and/or to improve bonding for coupling reactions. U.S. Pat. No. 9,258,892 B2 (Crosley) discloses the use of hollow glass microspheres that have been surface treated with an alkaline solution to obtain a dielectric substrate layer having low dielectric constant and low dissipation factor. According to Crosley, as compared with hollow glass microspheres subjected to traditional surface treatment using an acid solution, the hollow glass microspheres treated with an alkaline solution achieved improved results (i.e., lower dielectric constant and lower dissipation factor). Despite the use of a different solution, Crosley requires the wash of glass spheres to modify the surface property of the particles by an alkaline solution. In addition, Crosley does not teach the formation of films that can be handled and processed without a substrate. Indeed, the dielectric formulation described in Crosley, as exemplified by the examples described therein, are demonstrated to be suitable for prepregs.

The vast majority of multilayer PCBs are fabricated using prepregs. Thus, there is a variety of known art on specific thermosetting resin compositions deemed to be beneficial for use in prepregs. The general trend towards low expansion prepregs is realized by using thermosetting compositions having high glass transition temperature (Tg). Such compositions, however, tend to be brittle or have solid-like behavior; and thus would be expected to have poor film forming capability and require a support, such as fiberglass, to be useful in PCB fabrication. Such thermosetting compositions are likely unsuitable even for the creation of a film that may be transferred from one substrate to another substrate, i.e., the Type-3 curable films as defined herein (see below). Even if a selection of the thermosetting composition could form a Type-3 film when coated on copper (often called resin coated copper or RCC), such RCC has the drawbacks in PCB fabrication including poor dielectric spacing control. Thus, there is a need for thermosetting compositions that can form better films that are more suitable for use in PCB fabrication, including, for example, applications as PCB base materials for replacement of core and/or prepregs in conventional and HDI PCB manufacturing.

Based on phenoxy/epoxy thermosetting compositions, Anjinmoto Build-up Film (ABF) as described, for example, in U.S. Pat. No. 6,805,958 B2 (Nakamura et al.), is a curable film used in the electronics industry that can be handled without a supporting substrate and is a common material for IC packages. However, it is little, if at all, used for PCB fabrication. U.S. Pat. No. 11,359,062 B1 (Amla et al.) describes curable films based on PHAF/epoxy thermosetting compositions that are similar to ABF in dielectric constant but with lower cured Tg. Both examples, however, have the limitations of dielectric constant (Dk) greater than 3 and relatively high dielectric loss of greater than 0.005, 0.010, or even 0.015, at 10 GHz.

Successful development of better curable films that can replace conventional prepregs and/or cores for PCB fabrication could enable PCBs with improved reliability, in particular, if the thus-cured film-based material in the PCB has low modulus and low Tg as described in U.S. patent application Ser. No. 17/700,928 (the entire disclosure of which is incorporated herein by reference). Further, in recent years, the signal band of information communication devices such as PHS or portable telephones and the CPU clock time of computers reach to a GHz band and higher frequencies are more and more frequently used. The dielectric loss of electric signals is proportional to the product of the square root of dielectric constant of an insulator forming a circuit, the dielectric loss tangent thereof, and the frequency of signals to be used. Therefore, as the frequency of signals to be used becomes higher, the dielectric loss increases. The dielectric loss damps electrical signals and impairs the reliability of the signals. For inhibiting such impairment, it is required to select a material having a small dielectric constant and a small dielectric loss tangent as an insulator.

U.S. Pat. No. 7,541,408 B2 (Ohno et al.) describes an adhesive film having very low dielectric constant for bonding sheet or cover-lay applications in flexible printed circuits (FPCs). Ohno's film contains a divinyl polyphenylene ether with a molecular weight of 70,000 to 300,000. The FPC generally has a structure in which a circuit pattern is formed on a copper foil laminated on a plastic film having heat resistant and insulating properties, typified by polyimide, and the circuit pattern is filled with a thermosetting insulative resin and then is covered with another heat-resistant film. The film in which the uncured circuit pattern filling resin and the heat resistant film are integrated in advance is referred to as a cover lay film, and various types thereof have been proposed so far. In addition, FPC is widely made to have a multi-layered structure for high-density mounting, and a bonding sheet obtained by processing a thermosetting adhesive agent into a thin sheet has been used to form the multi-layered structure. Although insulating properties between a copper foil layer and another copper foil layer are ensured via a polyimide film in a FPC prepared by a method utilizing a flexible copper clad laminate (FCCL) obtained by laminating a copper foil on a polyimide film or the like, a cover lay film, and a bonding sheet, a method in which a polyimide film or the like is not used and a thermosetting adhesive agent used in the cover lay film or the bonding sheet is utilized to ensure the insulating properties between the copper foil layers has been proposed corresponding to recent requests for high functionality, particularly thinning, of FPC. A Flexible Resin Coated Copper (FRCC) in which an uncured thermosetting adhesive layer and a copper foil are integrated is used in the method. Base layer for PCB applications requires filler. However, the incorporation of filler is known to have a deleterious effect of film forming or film handling properties. Ohno highlights the difficulty of making ideal curable films, especially Type-5 curable film as defined herein (see below), even when there is no filler present in the curable film.

Thus, with decreasing size of board features and increasing frequencies of signals, there is a need for curable films which have low dielectric constants, which are easy to process, which are capable of forming dielectric layers thinner than those currently available, and which have excellent thermomechanical properties.

SUMMARY OF INVENTION

In view of the above-noted problems, an object of the present invention is to provide a composition for curable films that are thin, that are easy to process, and that have excellent dielectric and thermomechanical properties when cured. Another object is to provide a curable film suitable for replacing prepregs in PCBs, especially multilayer PCBs and HDI PCBs. In particular, it is an object of the present invention to provide a curable film that is releasable and transferable, that has no or low tackiness, that can be handled in a freestanding state, and that can be used to make a cured product having a low dielectric constant, a low dielectric loss tangent, and excellent heat resistance. These and other objects have been achieved according to the present invention.

The inventors have developed, in the present invention, a novel class of curable films that can be used as dielectric base materials with an entirely new range of thermomechanical properties previously taught to be unacceptable for use as PCB base materials. The curable films of the present invention are relatively flexible but can be readily incorporated to make rigid multilayer PCBs. Despite decades of teaching that dielectric base materials with both high CTE and low tensile modulus were impossible to employ in PCBs, the inventors have surprisingly found that the materials of the present invention are compatible for use with copper conducting layers in PCBs. Indeed, the curable films of the present invention can be used to manufacture reliable multilayer HDI PCBs without failure during thermal processing; can be employed in multilayer HDI PCB designs without failure of the conducting interconnects during temperature excursions of hundreds of degrees celsius; and can be employed over many cycle lifetimes without fracture of the vias or micro-vias. Most surprisingly, the dielectric materials of the present invention have been demonstrated to enable the fabrication of reliable multi-layer HDI PCB structures of at least 14 layers which include stacked micro-vias directly on top of buried vias which are unable to be made with any other currently available dielectric material. Thus, the novel dielectric base materials of the present invention enable previously unachievable design elements to reliably be incorporated into multilayer HDI PCB structures, which have never before been possible, and which are able to survive fabrication and thermal cycling without the disruption of the interconnections between the conducting layers.

In particular, the inventors have surprisingly discovered that when a rubber composition containing one or more diene rubbers is mixed with hollow glass microspheres of proper particle size, or is mixed with a maleimide resin and fillers, such as silica and glass microspheres, curable films (especially Type-5 curable films as defined herein below), which are homogeneous and isotropic, easy to process, free of cracks or voids even at a high load of fillers, can be obtained. Such curable films are ideal for making dielectric layers having desirable thermomechanical and dielectric properties, especially for multilayer PCBs and HDI PCBs, because they enable the manufacture of reliable and durable PCBs by reducing the incidence of PCB failure. The dielectric materials of the present invention are also useful as semiconductor interconnect (IC) packages, energy storage materials, high-performance composites (e.g. reinforced plastics) for structural or non-structural applications (e.g., automotive, aerospace, and decorative applications), dielectric adhesives (as used in the manufacture of electrical goods or for bonding), and other applications where the ability to precisely control electrical, mechanical, and thermal properties is important.

According to an embodiment of the present invention, there is provided a curable film composition or a curable film containing hollow glass microspheres (HGMs) with a specified particle size and a rubber composition. The rubber composition preferably contains one or more diene-based rubbers. In particular, the curable film contains 2-65 wt % HGMs as Component (A); and a rubber composition containing a diene-based rubber preferably having a weight average molecular weight of at least 60,000 as Component (B). The HGMs may be used as is. Specifically, it has been surprisingly shown in this invention that, against the teaching of the prior art and contrary to the knowledge of one of ordinary skill in the art, no pre-washing of the HGMs using either an acid solution or an alkaline solution is required to achieve desirable electronic properties (e.g., low Dk and low Df). Optional components contained in the curable film composition or the curable film include other non-elastomeric polymers or oligomers, such as maleimide resins, hydrocarbyl thermoplastic polymers, and styrene maleic anhydride resins. According to an embodiment of the present invention, the curable film composition or the curable film comprises one or more fillers other than HGMs.

According to another embodiment of the present invention, there is provided a curable film composition or a curable film containing fillers, a rubber composition, and a maleimide resin. In this embodiment, the maleimide resin, together with the fillers and the rubber composition, is a required component. The rubber composition preferably contains one or more diene-based rubbers. In particular, the curable film composition or the curable film contains: 10-80 wt % fillers, such as silica and HGMs, as Component (A): a rubber composition containing a diene-based rubber preferably having a weight average molecular weight of at least 60,000 as Component (B); and a maleimide resin with a solubility in toluene of at least 5 g/100 ml at ambient temperature as Component (C).

The diene-based rubber may be one or more selected from the group consisting of a styrene-butadiene rubber (SBR), other styrene-based rubbers, such as styrenic block copolymers (SBCs), polybutadiene (PBD), polyisoprene (IR), butyl rubber (BR), ethylene propylene rubber (EPR), ethylene propylene diene monomer rubber (EPDM) which may, or may not, be partially or fully hydrogenated, and hydrogenated styrene block copolymers (HSBCs).

The curable film composition of the present invention can either be free of a woven or a non-woven fabric or contain a woven or non-woven fabric. The curable film of this invention can either be free of a reinforcing layer or contain a reinforcing layer. In some embodiments, the curable film composition of this invention can be used to impregnate a woven or a non-woven fabric, whether the fabric is anisotropic, quasi-isotropic, or substantially isotropic.

According to an embodiment of the present invention, the rubber composition (i.e., Component (B)) of the curable film composition further contains one or more liquid rubbers and/or low molecular weight diene-based rubbers. According to an embodiment of the present invention, the rubber composition (B) further contains a polyphenylene ether or polyphenylene ether resin. According to an embodiment of the present invention, the rubber composition (B) further comprises one or more radical initiators and/or curing agents According to an embodiment of the present invention, the curable film optionally comprises a flame retardant. According to an embodiment of the present invention, the curable film optionally comprises one or more auxiliary agents, such as adhesion promoters, silane coupling agents, and antioxidants.

According to an embodiment of the present invention, there is further provided a method of preparing the curable film by processing the curable film composition into a film form. According to an embodiment of the present invention, the curable film may be provided on a carrier substrate and thus a film assembly containing the curable film and a carrier film can be obtained. The curable film can be released from the carrier film and/or transferred to another substrate from the carrier film while still has sufficient integrity to be handled in a freestanding form. The carrier substrate may be disposable.

According to an embodiment of the present invention, the curable film is incorporated into an assembly and cured to obtain a cured product. In another embodiment, a cured film is obtained by curing the curable film clad on one or both sides with copper to yield a core. This core does not contain fiberglass reinforcement and is therefore a skew-free core. In another embodiment, the curable films replace conventional prepregs in making circuit laminates. In another preferred embodiment, a dielectric layer is obtained from the curable film. The dielectric layer can be used in PCBs.

The foregoing paragraphs have been provided by way of general introduction and are not intended to limit the scope of the following claims. The described embodiments, together with further advantages, will be best understood by reference to the following detailed description taken in conjunction with the accompanying drawings.

DETAILED DESCRIPTION

Figure 1A:
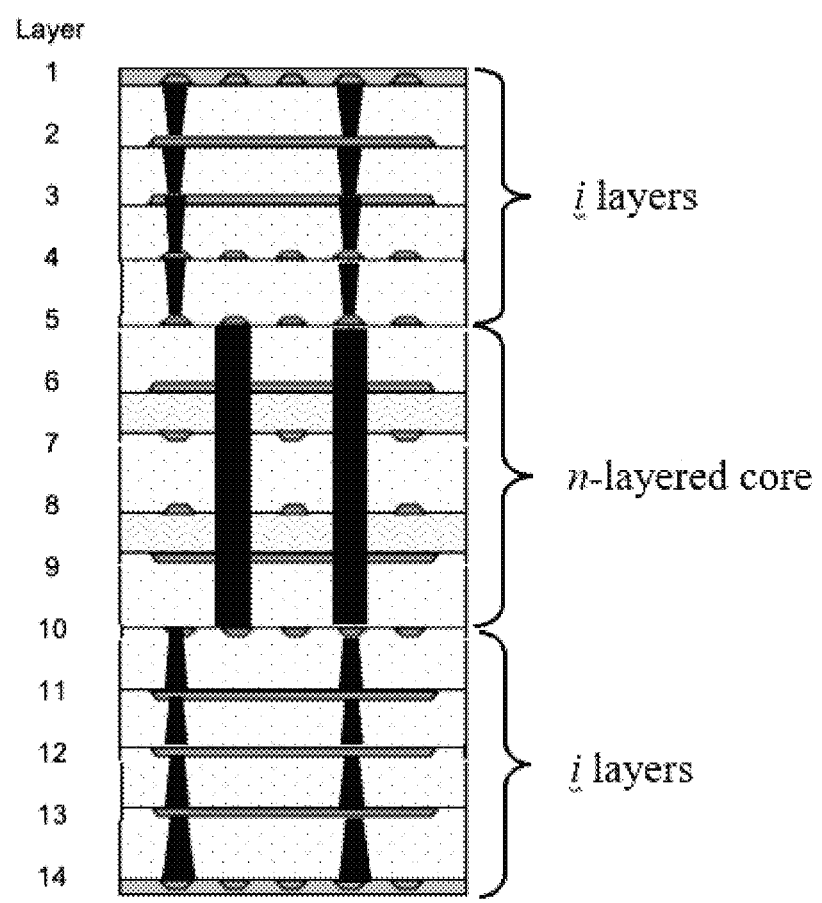
FIG. 1A illustrates an exemplified i+n+i HDI PCB, where the middle is a glass reinforced n-layered core and the external i layers are prepreg-based layers.
Figure 1B:
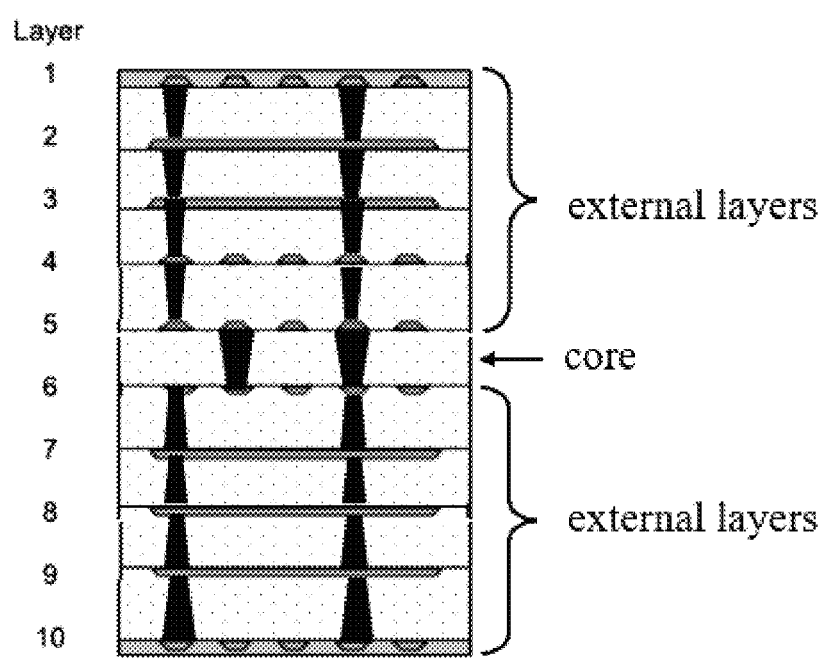
FIG. 1B illustrates an exemplified any-layer HDI PCB, where the middle is a double-sided glass reinforced core and the external layers are prepreg-based layers.

As used herein, where the terms "invention," "the invention," "the present invention," and the like appear in both headings and text, they refer to the particular embodiment immediately following. They are not broadly limiting overall, or generally limiting with regard to the several individual advances in the art described herein.

When an amount, concentration, or other value or parameter is given herein as a range, and/or as a list of values, this is to be understood as specifically disclosing all ranges formed from any pair of any upper and lower values, including the endpoints thereof, and as including all integers and fractions within the range, regardless of whether all such ranges, integers, and fractions are separately disclosed. For example, a range of 1-10 includes and discloses 3 and 5.5. It is not intended that the scope of the present invention be limited to the specific values recited when defining a range.

The use of "a" or "an" to describe various elements and components is to give a general sense of the disclosure. Such terms should be read to include one or more elements and components unless it is clear that it is otherwise intended.

The terms "about" and "approximately" as used herein refer to being nearly the same as a referenced amount or value and should be understood to encompass ±5% of the specified amount or value. The term "substantially" as used herein, unless otherwise defined, means all or almost all or the vast majority, as would be understood by a person of ordinary skill in the art. It is intended to take into account some reasonable variance from 100% that would ordinarily occur in practice, such as in industrial-scale or commercial-scale situations.

"Prepreg" as used herein means a woven or nonwoven fabric that has been impregnated with a thermosetting composition.

"Ambient temperature" or "room temperature" as used herein means the temperature range of 15-25° C.

In this disclosure, depending on their appearance, homogeneity, and processibility, different curable films are separated into the following five types.

"Type-1 curable film" (sometimes simplified as "Type-1 film") refers to a coating or covering on a supporting substrate, the film having heterogeneous coverage and non-uniform morphology as characterized by, for example, different thickness and the presence of defects such as voids, vacant spaces, clumps, and cracks. A composition can form a Type-1 film as long as it can be spread onto the supporting substrate even if it has a high viscosity.

"Type-2 curable film" (sometimes simplified as "Type-2 film") refers to a coating or covering on a supporting substrate, the film being substantially even and homogeneous and having no obvious defects such as voids, vacant spaces, clumps, and cracks.

"Type-3 curable film" (sometimes simplified as "Type-3 film") refers to a coating or covering having a free surface and a contacting surface contacting a supporting substrate, the film being substantially even and homogeneous; having no obvious defects such as voids, vacant spaces, clumps, and cracks; and being transferable or releasable from the original supporting substrate to a new supporting substrate by contacting the new supporting substrate with the free surface of the film. Pressure-sensitive adhesives and iron-on transfers as used in T-shirts and cloths are examples of Type-3 films.

"Type-4 curable film" (sometimes simplified as "Type-4 film") refers to a coating or covering on a supporting substrate, the film being substantially even and homogeneous; having no obvious defects such as voids, vacant spaces, clumps, and cracks; and being peelable in its entirety from the supporting substrate in one piece. Type-4 film differs from Type-3 film in that Type-4 film does not resort to another substrate to remove the film from its original supporting substrate and can at least temporarily exist without a substrate. Although Type-4 film, after being peeled off, can exist at least temporarily without a substrate, the film cannot be processed without a substrate. As such, Type-4 film, after being peeled from its original supporting substrate, must be transferred to a new substrate for manipulation. Anjinmoto Build-up Film (ABF) described in U.S. Pat. No. 6,805,958 B2 (Nakamura et al.) is an example of Type-4 films.

"Type-5 curable film" (sometimes simplified as "Type-5 film") refers to a coating or covering on a supporting substrate, the film being substantially even and homogeneous; having no obvious defects such as voids, vacant spaces, clumps, and cracks; and being peelable in its entirety from the supporting substrate in one piece that can be handled without a substrate. Thus, Type-5 film differs from Type-4 film in that Type-5 film can be handled, processed, or manipulated while unsupported and free from a substrate. Type-5 film is essentially a film which is self-supporting without being combined with a base material (such as glass cloth, glass or aramid nonwoven fabric), or without being supported by a substrate. Rogers 2929 bondply is an example of Type-5 films. The film based on PHAE/epoxy thermosetting compositions described in U.S. Pat. No. 11,359,062 B1 (Amla et al.) is another example of Type-5 films.

The inventive film composition described herein is used to form curable films that are Type-3, Type-4, and Type-5 films, preferably Type-4 and Type-5 films, and more preferably Type-5 films. The curable films can be used to replace prepregs and/or cores in PCB fabrication and enable the fabrication of high-reliability micro-vias. The curable films have low insertion loss because the thus-cured films as an isolating layers have a low dielectric dissipation factor (Df) (for example, <0.005, 0.004, <0.003, <0.002, <0.0015, or <0.0012, or about 0.001, or about 0.0009, measured at 10 GHz), or a combination of low Df and mid-low Dk (for example, 2.8-3.1 measured at 10 GHz), low Dk (for example, 2.5-2.8 measured at 10 GHz), very-low Dk (for example, 2.2-2.5 measured at 10 GHz), or ultra-low Dk (for example, 1.8-2.2 measured at 10 GHz).

In a preferred embodiment of the present invention, a curable film composition or a curable film includes hollow glass microspheres as Component (A) and a rubber composition containing one or more diene-based rubbers as Component (B). The content of the hollow glass microspheres in the curable film ranges from about 2 wt % to about 65 wt %, relative to the total weight of the curable film. The curable film can further contain particulate fillers other than the hollow glass microspheres; and the total content of fillers in the curable film ranges from about 2 wt % to about 80 wt %, relative to the total weight of the curable film. The diene-based rubber preferably has a weight average molecular weight of at least 60,000. The rubber composition (B) can further contain initiators and/or curing agents. The rubber composition (B) can further contain other components, such as liquid rubbers, polyphenylene ethers, and low molecular weight diene rubbers. The curable film can further include other non-elastomeric polymers, flame retardants, and other auxiliary agents.

In another preferred embodiment of the present invention, a curable film composition or a curable film includes fillers, such as silica and hollow glass microspheres, as Component (A); a rubber composition containing one or more diene-based rubbers as Component (B); and a maleimide resin as Component (C). The content of the fillers ranges from about 10 wt % to about 80 wt % in the curable film. The diene-based rubber preferably has a weight average molecular weight of at least 60,000 The maleimide resin has a solubility in toluene of at least 5 g/100 ml at ambient temperature, and preferably has a weight average molecular weight of at least 1,000. The rubber composition (B) of the curable film can further contain initiators and/or curing agents and other components, such as liquid rubbers, polyphenylene ethers, and low molecular weight diene rubbers. The curable film can further include other non-elastomeric polymers, flame retardants, and other auxiliary agents.

According to an embodiment of the present invention, the curable film has a thickness from about 10 μm to about 250 μm. In one embodiment, the curable film can be stacked together to provide a larger thickness, and the stacked films can be cured with heat and pressure to a target layer thickness, which may be larger than 250 μm.

[Rubber Composition]
<Diene-based Rubber>

In an embodiment of the present invention, a diene rubber is an essential component of the curable film. The IUPAC defines an elastomer as a polymer that displays rubber-like elasticity. In other words, a diene rubber is an elastomer, which is a polymer with viscoelasticity and generally a low Young's modulus and high elongation when compared to other polymers, such as engineering thermoplastics (e.g., Nylon, PET) The inventors of the present invention have found that elastomer is a key element toward imparting excellent film-forming ability, good film handling properties, and ability to produce, for example, Type-5 films, even with high loadings of fillers (e.g., HGMs, silica, and other particulate fillers). For example, it has been found that a composition containing elastomer in an amount of 10 wt % or less in addition to other components can be used to make Type-5 curable films; while a composition containing all the other components excluding the elastomer nonetheless cannot be used to even make Type-1 or Type-2 films. The inventors have also found that when appropriately formulated, elastomers also engender good heat resistance and excellent electrical properties to a cured product, enabling the use of elastomer as a component of prepreg replacements for PCB fabrication.

The mechanism is unknown. However, without wishing to be bound by theory, the inventors believe that the fact that elastomers are amorphous polymers at an ambient temperature of 15-25° C. due to their low glass transition temperatures (Tg) is a key factor. It is discovered that a broad range of elastomeric materials can be used. For the purposes herein, "elastomeric material(s)," "elastomer(s)," and "rubber(s)" are interchangeable terms, which include natural rubber, synthetic rubbers, diene-based rubbers (including diene rubbers), and thermoplastic elastomers. The elastomeric material used in the curable film compositions described herein may also be bio-derived or bio-based instead of petrochemically derived. That is, the chemical feedstocks used for the synthesis of the rubber may be entirely, or in part, derived from bio-renewable sources.

Diene-based rubbers are one of the preferable choices for the rubber composition (B) of the curable film of the present invention. The diene-based rubbers typically are amorphous polymers having a Tg ranging between 170 K and 250 K (−100° C. and −25° C.) and contain unsaturated sites which make them capable of being curable (i.e., cross-linkable) or co-curable with other components that may be incorporated into the curable film composition. Preferably, the diene-based rubber is at least one selected from the group consisting of styrene-butadiene rubber (SBR), other styrene-based rubbers, such as styrenic block copolymer (SBC), polybutadiene (PBD), polyisoprene (IR), butyl rubber (BR), ethylene propylene rubber (EPR), and ethylene propylene diene monomer rubber (EPDM). The rubber may be partially or fully hydrogenated. For example, hydrogenated styrene block copolymers (HSBCs) can be used. It should be mentioned that while other widely available rubbers, such as nitrile-butadiene rubber (NBR) and polychloroprene (CR), may be used to make Type-5 films, their use is limited in PCB related applications due to the undesirable electrical and/or thermal resistance properties of the cured product.

In some embodiments, styrene-based elastomers are particularly preferable and may include random copolymers and block copolymers. In some embodiments, such suitable elastomers include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B.

In some embodiments, the compound used to provide block (A) is an alkenyl aromatic compound, such as the one disclosed in U.S. Pat. No. 9,265,160 B2 (Paul et al.). In some embodiments, the alkenyl aromatic compound is styrene.

In some embodiments, the conjugated dienes used to provide block (B) include 1,3-butadiene, 2-methyl-1,3-butadiene (isoprene), sesquiterpene (e.g., farnesene-based), 2,3-dimethyl-1,3-butadiene, and 1,3-pentadiene, specifically 1,3-butadiene and isoprene. A combination of conjugated dienes can be used. The diene can be derived from bio-renewable sources. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene) copolymer (SEP), styrene-(ethylene-propylene)-styrene triblock copolymer (SEPS), styrene-ethylene-(ethylene-propylene) triblock copolymer (SEEP), styrene-(ethylene-butylene) diblock copolymer (SEB), and hydrogenated styrene farnesene copolymer (HSFC).

In some embodiments, the rubber may be selected from a vinyl-bond rich elastomer. The vinyl containing elastomer may have high-vinyl content (e.g., greater than 70%, 80%, or 90% of the appropriate constituent units having vinyl groups), moderate vinyl content (e.g., between 30-70% of the appropriate constituent units having vinyl groups), or low vinyl content (e.g., less than 30% of the appropriate constituent units having vinyl groups).

In some embodiments, the rubber may be modified, or post-modified, with other reactive groups that may aid in the compatibilization of the components in the curable film or may modify the properties of the film after curing, such as promoting the adhesion to substrates. Examples of the modification include the rubber midblock, or other block, grafted with maleic anhydride, and a block modified with silicon. In some embodiments, the rubber may be substantially devoid of alkenyl or vinyl groups, for example, by substantial hydrogenation; nevertheless, the cured product of the curable film containing the rubber is still suitable as a PCB interlayer because the cured product does not exhibit appreciable creep.

Illustrative but non-limiting examples of commercially available elastomers that can be used as the diene-based rubber of the rubber composition (B) of the present invention include those under the trade names of Kraton®, Stereon®, Septon®, Hybrar®, K-Resin®, Styroflex®, Styrolux®, Royalene®, Royaledge®, Diene®, and Royalthrem®.

Although not particularly limiting, the molecular weight of the diene-based rubbers is typically, >10,000, preferably >50,000 or >60,000, and more preferably >100,000 or >200,000. The rubber composition (B) of the curable film compositions may contain one diene-based rubber or more than one diene-based rubbers that may be of different molecular weights.

The melt flow index of the diene rubber may vary and is not particularly limiting as long as other factors are considered, such as the total filler loading, other non-elastomeric components present in the rubber composition (B), target rheology for a PCB press lamination process, and the choice of the radical initiator in the rubber composition (B). Additionally, for replacing a prepreg layer, the curable film may be required to possess suitable rheology to flow and fill the copper traces of the underneath layer. Under such circumstances, diene-based rubbers with a higher melt flow rate are typically more desirable. For example, a melt flow index at 190-200° C. in the 2-10 kg range is preferably >1, >2, >5, >10, >15, or >20. In some embodiments, a melt flow index at 190-200° C. in the 2-10 kg range is from about 1-200, 1-3, 3-50, 5-10, 10-20, 20-100, or 20-200.

In some embodiments, the amount of the one or more diene-based rubbers contained in the rubber composition (B) of the curable film ranges from about 55 wt % to about 100 wt % (e.g., 99 wt %, 90 wt %, 80 wt %, 70 wt %, 65 wt %, 60 wt %, and 55 wt %), relative to the total weight of the rubber composition (B). In some embodiments, the diene-based rubber(s) are present in the rubber composition (B) in an amount of about 15 wt % to about 50 wt % (e.g., 50 wt %, 45 wt %, 40 wt %, 35 wt %, 30 wt %, 25 wt %, 20 wt %, and 15 wt %), relative to the total weight of the rubber composition (B). In some embodiments, the diene-based rubber(s) can be present in the curable film composition in an amount as little as about 5 to 15 wt % (e.g., 5 wt %, 8 wt %, 10 wt %, and 13 wt %), relative to the total weight of the curable film. In some embodiments, the diene rubber(s) can be present in the curable film composition in an amount ranging from about 20 wt % to 90 wt % (e.g., 20 wt %, 22 wt %, 30 wt %, 36 wt %, 46 wt %, 50 wt %, 55 wt %, 60 wt %, 65 wt %, 70 wt %, 75 wt %, 80 wt %, 85 wt %, and 90 wt %), relative to the total weight of the curable film.

<Initiator, Curing Agent>

The films of the present invention are curable, whereby components within the film may react and/or crosslink to "set" the film such that the cured material will not demonstrate detrimental creep behavior. In an aspect, the curable film can be cured at a temperature from about 80° C. to about 250° C., and preferably from about 120° C. to about 250° C., and more preferably from about 140° C. to about 220° C. In an aspect, the films have a long working time at room temperature or below, thereby having a sufficient "shelf life" such that they can be stored and then used in the field (for example, they can be cured when used for PCB fabrication) many weeks, months, or years after their manufacture. It is not a requirement of the present invention that the curable film be completely crosslinked under the conditions of curing for use. What is important is the desired rheological behavior of the cured product; for example, there should be effectively no creep when the cured film is used as an insulating layer in PCBs. As many diene rubbers have the potential to cure thermally in the absence of any external curing promoters or curing agents, in some embodiments of the invention, the curable film composition does not include a curing agent, particularly in the case where the diene rubber of the rubber composition (B) is vinyl rich. However, in a preferred embodiment, the rubber composition (B) of the curable film includes a radical initiator and/or a curing agent such that the curing behavior of the film is appropriate and suitable for use, for example, in the lamination process typical of PCB fabrication. One important factor to consider in selecting proper radical initiators and/or curing agents is that they do not appreciably activate reaction during drying, especially when the curable film composition is prepared involving solvent.

The rubber composition (B) may comprise a free radical source that can be, for example, thermally activated as an initiator or a curing agent. Examples of free radical sources that are capable of being activated thermally include peroxides, azo compounds (e.g., α,α'-azobis (isobutyronitrile)), redox initiators (e.g., a combination of a peroxides such as $H_2O_2$ and a ferrous salt), and azides (e.g., acetyl azide). The free radical source can comprise at least one of a peroxide initiator, an azo initiator, a carbon-carbon initiator, a persulfate initiator, a hydrazine initiator, a hydrazide initiator, and a halogen initiator. The free radical source can comprise at least one of 2,3-dimethyl-2,3-diphenylbutane, 3,4-dimethyl-3,4-diphenylhexane, and 1,4-diisopropyl benzene. The free radical source can comprise an organic peroxide, for example, at least one of dicumyl peroxide, t-butyl peroxybenzoate, α,α'-di-t-butyl peroxy, diisopropylbenzene, and 2,5-dimethyl-2,5-di(t-butylperoxy)-3-hexyne. The free radical source can comprise a peroxide that has a decomposition temperature of at least 50° C. Examples of peroxides include ketone peroxides (e.g., methyl ethyl ketone peroxide and cyclohexanone peroxide), peroxyketals (e.g., 1,1-bis(t-butyl peroxy)-3,3,5-trimethylcyclohexane and 2,2-bis(t-butyl peroxybutane), hydroperoxides (e.g., t-butyl hydroperoxide and 2,5-dimethylhexane-2,5-dihydroperoxide), dialkyl peroxides (e.g., dicumyl peroxide, 2,5-dimethyl-2,5-di-t-butyl peroxylhexyne-3, and α,α'-bis(t-butyl peroxy-m-isopropyl) benzene), diacyl peroxides (e.g., octanoyl peroxide and isobutyryl peroxide), and peroxycarbonates (e.g., a peroxydicarbonate such as di(4-t-butylcyclohexyl)peroxydicarbonate)).

Curing agents are not limited and are generally those useful in initiating curing of the relevant polymers, oligomers, and/or monomers contained in the film composition. Examples include, but are not limited to, azides, peroxides, diazo compounds, sulfur, and sulfur derivatives. In a particularly preferred embodiment, the curing agent is a peroxide based. Suitable organic peroxides may include, but are not limited to, dialkyl peroxide-type (e.g., dicumyl peroxide, 2,5-dimethyl-2,5-di-t-butyl peroxylhexyne-3, α,α'-bis(t-butyl peroxy-m-isopropyl)benzene, di-t-butyl peroxide, di-t-amyl peroxide, 2,5-dimethyl-2,5-di(t-butylperoxy)hexyne-3), and 2,5-bis(t-butylperoxy)-2,5-dimethylhexane)), peroxybenzoate-type (e.g., t-butyl peroxybenzoate), peroxyacyl-type (e.g., t-butyl peroxyacetate), hydroperoxides (e.g., t-butyl hydroperoxide and 2,5-dimethylhexane-2,5-dihydroperoxide), diacyl peroxide-type (e.g., lauroyl peroxide), dibenzoyl peroxide-type (e.g., dibenzoyl peroxide and di-(4-methylbenzoyl) peroxide), ketone peroxide-type (e.g., methyl ethyl ketone peroxide and cyclohexanone peroxide). Suitable carbon-carbon type initiators include, but are not limited to, 2,3-dimethyl-2, 3-diphenyl butane and 3,4-dimethyl-3,4-diphenylhexane.

In a preferred embodiment, the rubber composition (B) also comprises as peroxide-based radical initiator. In an embodiment, the free radical initiator source is selected with a decomposition 10 h half-life temperature of at least 50° C. In an embodiment, the free radical initiator source is selected with a decomposition 10 h half-life temperature of at least 100° C. The cure initiator, when used, is typically present in an amount of about 0.1 wt % to about 5 wt %, based on the total weight of the curable film. The amount loading and nature of the cure initiator may influence various properties, such as the lamination properties of the curable film and the post-lamination properties of the cured film, which include, for example, the flowability or rheology of the film, the time and temperature required to reach an appropriate or final state of cure, and post-lamination (or post-curing) properties such as the mechanical properties (e.g., modulus), expansion properties (e.g., CTE), and electrical properties (e.g., the dissipation factor). Further, the shelf life of the curable film (i.e., the working time or the expiration date), may be, in part, dictated by the amount and selection of the initiator. In a preferred embodiment, the curable films of the present invention have a long shelf life at room temperature of at least weeks, months, or years. In an embodiment, the curable film has a shelf life at room temperature of at least one year.

<Liquid Rubber>

It may be beneficial to include one or more liquid diene-based rubbers (herein sometimes referred to as liquid rubbers or "LRs") into the rubber composition (B) of the curable film for the purposes of controlling the rheological profile upon the application of pressure and heating such as when PCB layers are constructed in a platen press. For example, for the purposes of replacing prepregs in the conventional PCB or HDI PCB manufacturing methods, the curable film of the present invention can be engineered with suitable curing and flow properties to fill and flow over the copper traces and low-pressure areas and enable acceptable dielectric spacing in the end cured PCB assembly or sub-assembly. The inclusion of LRs may also be used as a means to tailor the properties of the curable film in its cured or uncured state, for example, to adjust the Young's modulus, adhesion, electrical, or expansion properties.

While diene-based rubbers are elastomeric solids at ambient temperature, LRs have measurable viscosity at ambient or slightly elevated temperature and are liquid or resinous in form. LRs may be considered as lower molecular weight analogues of the solid elastomers, because liquid rubbers, which do not have high enough molecular weight, do not behave as solid elastomers. Examples of liquid rubbers that can be used to carry out the invention described herein are generally low molecular weight polymers and oligomers of their corresponding elastomeric rubbers described above. The molecular weight of the LRs may range from about 1,100 to about 11,000, from about 1,300 to about 11,000, from about 3,000 to about 11,000, or from about 10,000 to about 55,000. For example, most industrially available styrene-butadiene copolymer (SBC) and polybutadiene (PBD) based liquid rubbers have an average molecular weight of less than 10,000. Liquid ethylene-propylene-diene-monomer (EPDM) rubbers and liquid ethylene-propylene rubber (EPR) typically have an average molecular weight of less than about 50,000. Other examples include liquid butadiene rubber (LBR), liquid isoprene rubber (LIR), liquid farnesene rubber (LFR), liquid farnesene-butadiene rubber (L-FBR), and liquid styrene-butadiene rubber (L-SBR), which may have a molecular weight ranging from about 1,300 to about 50,000.

The ideal content of the solid diene-based rubber(s) and liquid rubber(s) in the rubber composition (B) of the curable film depends on various factors including the viscosity of the liquid rubber, the stiffness of the elastomer, the total loading of filler, and the consideration of whether the curable film or the cured product obtained from curing the curable film is designed to replace a PCB core material or prepreg build-up material. In the case that the rubber composition (B) of the curable film contains at least one LR having a high viscosity (e.g., >100,000 centipoise at 40° C.), the LR is present in about 20 wt % to about 60 wt %, preferably from 40 wt % to 60 wt %, and more preferably from 50 wt % to 60 wt %, relative to the total weight of the curable film composition. In the case that the rubber composition (B) contains at least one LR having a low viscosity (e.g., <100,000 centipoise at 40° C.), the LR is present in lesser amounts of about 10 wt % to about 40 wt %, preferably from 10 wt % to 30 wt %, and more preferably from about 10 wt % to 20 wt %, relative to the total weight of the curable film composition. Type-5 curable films may be obtained with a diene-based rubber to liquid rubber ratio ranging from about 1:5 to 1:0.1, and preferably from about 1:3 to 1:0.3. A particular combination of diene-based rubber(s) and liquid rubber(s) must be carefully identified for a given application of the curable film or the cured product obtained from curing the curable film such as cover lay prepreg replacement, or core replacement, because, for example, if too much liquid rubber has been incorporated into the composition, a Type-5 film may not be obtained or the obtained curable film may have too much tackiness.

Preferably, the liquid rubber is co-curable with the other components of the rubber composition (B). The LR may contain vinyl groups (i.e., 1,2 addition vs 1,4 addition of the diene) and may have high-vinyl content (e.g., greater than 70%, 80%, or 90% of the appropriate constituent units having vinyl groups), moderate vinyl content (e.g., between 30-70% of appropriate constituent units having vinyl groups), or low vinyl content (e.g., less than 30% of the appropriate constituent units having vinyl groups). The LR may be bio-derived or bio-based.

The liquid rubbers can be modified or grafted LRs that contain elements other than hydrocarbon, such as melanized, carboxylated, hydroxylated, acrylated, siliconized, or epoxidized LRs that contain maleic anhydride, carboxy, hydroxy, acrylate, silicon, or epoxy functional groups. It should be noted that inclusion of certain modified liquid diene-based rubbers can have an adverse effect on the dissipation factor of the cured film if incorporated in large amounts.

Commercially available liquid rubbers that can be incorporated into the rubber composition (B) include LRs manufactured by Cray Valley, Kuraray, Synthomer, and Evonik. Specific but non-limiting examples of suitable predominately hydrocarbon only LRs include Ricon 300, Ricon 130, Ricon 131, Ricon 134, Ricon 154, Ricon 156, Ricon 157, Ricon 100, Ricon 184, Ricon 257, LIR-50, L-SBR-820, L-SBR-841, LIR290, Polyvest EP MV, Litheneactiv® 1000, and Lithene® ultra. Specific but non-limiting examples of modified LRs include Ricon 130MA8, Ricon 130MA13, Ricon 130MA20, Ricon 603, Ricobond 1756, Ricobond 2031, Ricon CF MA8, Ricon MA6, Ricon 605 E, Polyvest EP MAT, Polyvest EP Mv, Poly BD 605E, Polvest ST-E 60, Polvest H, and LIR-410.

<Polyphenylene Ether>

Poly(arylene ether)s are commonly referred to in the art as polyphenylene ethers or poly(phenylene ether)s, or simply "PPEs." The rubber composition (B) of the curable film described herein may comprise one or more PPEs, including modified or functionalized PPEs.

The incorporation of PPEs may tune the film properties such as in limiting cases where film tackiness is high or when release from the carrier is difficult. In addition to improving the handling properties of the uncured film, the introduction of PPEs into the rubber composition (B) may also modify the properties (such as Tg, Young's modulus, and adhesion strength) of the resultant cured product. In particular, the inventors have surprisingly found that the incorporation of PPE or modified PPE material in an amount of from about 5 wt % to about 30 wt %, or more preferably from about 7 wt % to about 15 wt %, based on the total weight of the rubber composition (B) of the curable film, can significantly improve the releasability of the curable film from its carrier, decrease the tackiness of the curable film (e.g., in the case when LR is present in the rubber composition (B)), and even convert a composition formulation that would otherwise be only capable of making a Type-3 film into a composition making a Type-4 or Type-5 film. The mechanism is unknown; however, without wishing to be bound by theory, the inventors believe that PPE-based materials are rigid-rods and likely serve as a stiffener aiding the elastomeric composition of the curable film, thus facilitating release of the curable film from the carrier.

Although the type of PPE-based material included in the rubber composition (B) is not particularly limited, it is preferred that the PPE-based material is co-curable with the diene elastomer or other components contained in the rubber composition (B).

Poly(arylene ether)s comprise a plurality of structural units of formula (1):

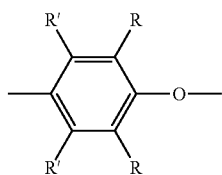

where each R and R' is independently hydrogen, halogen, primary or secondary $C_{1-7}$, alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl; and each R' is independently hydrogen or methyl. The PPE can be a homopolymer or a copolymer, including a graft or a block copolymer. Combinations of various forms can be used.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl dimethoxy-1,4-phenylene ether), poly(2,6-dichloromethyl-1,4-phenylene ether), poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The PPE may be functionalized such that it has reactive groups that allow it to participate in the curable behavior of the curable film by, for example, covalently incorporating into the rubber-based matrix. In a preferred embodiment, the PPE oligomer or polymer has reactive moieties or end groups enabling property enhancement of the rubber-based film. The PPE can be functionalized so as to provide a functional group that enhances adhesion between the conductive metal used to form the wiring layer and the dielectric layer and can improve other processing and performance properties. For example, PPE can be modified by using a functional compound having either or both of (i) a carbon-carbon double bond or a carbon-carbon triple bond, and (ii) one or more carboxy groups, including a carboxylic acid, anhydride, amide, ester, and acid halide. In one embodiment, the functional group is a carboxylic acid or ester group.

Examples of polyfunctional compounds that can provide a carboxylic acid functional group include maleic acid, maleic anhydride, fumaric acid, and citric acid.

In particular, suitable functionalized PPEs include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride; and more specifically, maleic anhydride or methacrylic anhydride. Maleinized PPEs can be produced by methods described in U.S. Pat. No. 5,310,820A (Nelissen et al.), or are commercially available.

Examples of commercially available suitable modified poly(arylene ethers) include the acrylate terminated, difunctional poly(arylene ethers) SA90 and SA9000 manufactured by SABIC, and PPE-MA (a maleinized poly(arylene ether)) from Asahi. Examples of commercially available suitable unmodified poly(arylene ethers) include Blendex HPP820 from Chemtura.

In an embodiment of the present invention, the curable film comprises at least one PPE, oligomers thereof, or PPE and oligomers thereof. It is preferable that the one or more PPEs contain two or more unsaturated groups, such as a triple bond, vinyl, alkenyl, and acrylate-type groups, at both ends of the molecular chain. For example, suitable functionalized poly(arylene ether)s include the reaction product of poly(arylene ether) and a styrene containing compound such that, after reaction, there are unreacted double bonds in the resulting polymer, see formula (2):

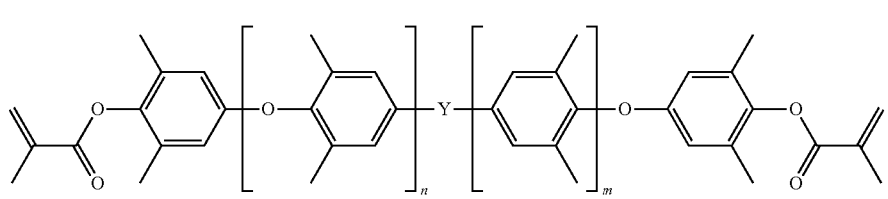

where Y is selected from the group consisting of a bisphenol A-type, a bisphenol F-type, a bisphenol S-type, a naphthalene-type, an anthracene-type, a biphenyl-type, a tetramethyl biphenyl-type, a phenol novolac-type, a cresol novolac-type, a bisphenol A novolac-type, and a bisphenol S novolac-type group, and m and n are each independently a natural number of 3 to 200.

[Fillers]

<Hollow Glass Microspheres (HGMs)>

The hollow glass microspheres (HGMs) used in the curable film composition of the present invention are typically borosilicate microspheres made from soda-lime borosilicate glass. HGMs made from other types of glass may be used. Although the borosilicate microspheres contain mostly $SiO_2$ and at least 1% of $B_2O_3$, the glass composition of the microspheres can vary to some extent depending on the starting material. An exemplary soda-lime borosilicate contains 80.7 wt % of $SiO_2$, 6.9 wt % of $Na_2O$, 10.3 wt % of CaO, 2.1 wt % of $B_2O_3$, and 1.9% of impurities.

Several methods are available to produce HGMs used in the present invention. A common approach involves the decomposition of a substance at very high temperature to form a gaseous composition within liquid droplets. The rapid expansion of the gaseous composition at high temperature causes the formation of a bubble. The hollow droplets are then rapidly cooled from the liquid state to form hollow microspheres. U.S. Pat. No. 3,699,050 (Henderson) discloses a dried-gel process to make HGMs. In this process, a solution of glass-forming oxides is dried to a hard residue or gel, which is then ground to a suitable particle size. The ground material is sieved into narrow size ranges and then mechanically dropped through a high-temperature furnace or spray tower. It appears that the chemically bound water in the gel inflates the particle as the surface melts, forming a hollow glass microsphere. Blowing agents can also be used in making HGMs. U.S. Pat. No. 4,904,293 (Gamier et al.) discloses the production of microspheres having a high silica content, in which a starting glass is reduced to fine particles by grinding, optionally mixed with a blowing agent, and then passed through the flame of a burner at a temperature of 1500° C. or above to form molten hollow microspheres that are then cooled to form solid hollow microspheres.

Alternatively, HGMs can be made by mixing trace amounts of a sulfur-containing compound, such as sodium sulfate, with a borosilicate glass. The mixture is then dropped into a hot flame that melts the powdered glass and sodium sulfate. The melting of the sodium sulfate results in a decomposition reaction that releases minute amounts of sulfur gas that form bubbles within the molten glass droplets. However, such HGMs are usually not preferred for making circuit materials, because the sulfur-containing compounds or other such polar compounds tend to have adverse effects during processing of the circuit materials. Instead, it is preferred that the gaseous composition inside the microspheres contains inert, non-polar, sulfur-free gases, such as nitrogen, carbon dioxide, and oxygen. The content of undesirable polar compounds, such as sulfur dioxide, should be controlled to be less than 1 wt %.

At least 95 wt % of the gaseous composition contained in the HGMs used in some embodiments of the present invention is inert, which is mainly composed of nitrogen, followed by carbon dioxide, oxygen, and argon.

The hollow glass microspheres have a D50 of equal to or less than 30 μm. Preferably, the HGMs have a D50 of less than 20 μm; more preferably, equal to or less than 19.5 μm or 18 μm. Even more preferably, the HGMs have a D50 of equal to or less than about 15 μm. Most preferably, the HGMs have a D50 of equal to or less than about 12 μm and a D95 of less than about 19.8 μm. In some embodiments, the HGMs comprised in the curable film can have a D50 ranging from about 1 μm to about 30 μm (e.g., 2 μm, 4 μm, 6 μm, 9 μm, 11 μm, 15 μm, 18 μm, 20 μm, 26 μm, 28 μm, and 30 μm). In some embodiments, the HGMs comprised in the curable film can have a D95 ranging from about 2 μm to 45 μm (e.g., 3 μm, 5 μm, 6 μm, 9, μm, 11 μm, 14 μm, 17 μm, 22 μm, 28 μm, 33 μm, 36 μm, and 39 μm). In some embodiments, the HGMs comprised in the curable film can have a D99 ranging from about 1 μm to 45 μm (e.g., 2 μm, 5 μm, 6 μm, 9, μm, 11 μm, 15 μm, 19 μm, 24 μm, 28 μm, 30 μm, 36 μm, and 39 μm).

The particle size and the particle size distribution of the HGMs need to be carefully selected and controlled, especially when it is desirable to prepare a "thin" film. For example, although both HGMs having an average particle size of about 35 μm and HGMs having an average particle size of about 12 μm can be used to make Type-5 films, it has been found that the former is not suitable for making thin films having thickness on the order of about 20 μm to 60 μm due to insufficient peel strength (e.g., <2 pounds per inch (lb/in)) caused by the larger particle size.

The density of the hollow glass microspheres is 0.1 g/cc or more, preferably 0.2 to 0.6 g/cc, and more preferably, 0.3 to 0.5 g/cc. In some embodiments, the HGMs may be used as supplied and without special surface pre-treatment, such as acid or alkaline treatment. In some embodiments, the HGMs may be modified with a surface functionalization agent, such as a silane coupling reagent, to enhance their compatibility with the polymeric matrix.

Commercially available hollow glass microspheres may be used. For example, HGMs manufactured by Trelleborg Offshore (Boston), Emerson and Cuming, Inc., W.R. Grace and Company (Canton, Mass.), and 3M Company (St. Paul, Minn.), which are sold in various grades according to density, size, and coatings may be used.

<Silica>

The curable film of the present invention may contain silica. Although not particularly limited by the type of silica, fused silica is preferred. The fused silica can have irregular or spherical morphology. The fused silica can have a D50 of about 0.1 to 50 μm, or about 0.1 to 10 μm, or about 0.1 to 1 μm.

The curable film can comprise silica in a volume content of about 10 to 70 vol %, or about 20 to 60 vol %, or about 40 to 55 vol %, or about 10 to 40 vol %, relative to the curable film. The curable film can comprise silica in a weight content of about 10 to 90 wt %, or about 20 to 70 wt %, or about 40 to 65 wt %, relative to the curable film.

The silica can be surface modified and/or functionalized. For example, the functionalized fused silica can be prepared by reacting a silane comprising a functional group. The functional group can comprise at least one of a (meth) acrylate group, a vinyl group, an allyl group, a propargyl group, a butenyl group, a styryl group, an aliphatic group, and a fluorinated group.

Examples of (meth)acrylate functional silanes include (3-acryloxypropyl)trimethoxy-silane, n-(3-acryloxy-2-hydroxypropyl)-3-aminopropyltriethoxysilane, (3-acryloxypropyl)methyldimethoxysilane, methacryloxypropyltrimethoxysilane, o-(methacryloxyethyl)-n-(triethoxysilylpropyl)urethane, n-(3-methacryloxy-2-hydroxypropyl)-3-aminopropyltriethoxysilane, methacryloxymethyltriethoxysilane, methacryloxymethyltrimethoxysilane, methacryloxypropyltriethoxysilane, (methacryloxymethyl)methyldiethoxysilane, (methacryloxymethyl)methyldimethoxysilane, methacryloxypropylmethyldiethoxysilane, methacryloxypropylmethyldimethoxysilane, methacryloxypropyldimethylethoxysilane, and methacryloxypropyldimethylmethoxysilane Examples of vinyl functional silanes include vinyltriacetoxysilane, vinyltriethoxysilane, vinyltriisopropenoxysilane, vinyltriisopropoxvsilane, vinyltrimethoxysilane, vinyltris(2-methoxyethoxy)silane, vinyltris(methylethylketoximino)silane, (divinylmethylsilylethyl)triethoxysilane, docosenyltriethoxysilane, hexadecafluorododec-11-enyl-1-trimethoxysilane, hexenyltriethoxysilane, 7-octenyltrimethoxysilane, o-undecenyltrimethoxysilane, o-(vinyloxybutyl)-n-(triethoxysilyl-propyl) urethane, vinyltris-t-butoxysilane, vinyltris (methoxypropoxy)silane, vinylmetlhyldiethoxysilane, vinylmethyldimethoxysilane, vinyldimethylethoxysilane, trivinylmethoxysilane, bis(triethoxysilylethyl)vinylmethylsilane, triethoxysilyl modified poly-1,2-butadiene, and diethoxymethylsilyl modified poly-1,2-butadiene. Examples of allyl functional silanes include 3-(n-allylamino)propyltrimethoxy silane, n-allyl-aza-2,2-dimethoxysilacyclopentane, allyltrimethoxysilane, allyloxyundecyltrimethoxysilane, allyltriethoxysilane, and 2-(chloromethyl)allyltrimethoxysilane. An example of a propargyl functional silane is o-(propargyloxy)-n-(triethoxy-silylpropyl) urethane. An example of a butenyl functional silane is butenyltriethoxysilane. Examples of styryl functional silanes include 3-(n-styrylmethyl-2-aminoethylamino) propyltrimethoxysilane and styrylethyltrimethoxysilane. An example of a cyclopentadienyl functional silane is (3-cyclopentadienylpropyl) trimethoxysilane. Examples of cyclohexenyl functional silanes include [2-(3-cyclohexenyl) ethyl] trimethoxysilane and [2-(3-cyclohexenyl) ethyl] trimethoxysilane. The functional silane can comprise at least one methacrylsilane of γ-methacryloxypropyl methyldimethoxy silane, γ-methacryloxypropyl trimethoxy silane, γ-methacryloxypropyl methyldiethoxy silane, and γ-methacryloxypropyl triethoxy silane.

<Other Fillers>

The curable film composition of the present invention can include one or more fillers other than the hollow glass microspheres and/or silica to further adjust the dielectric constant, dissipation factor, coefficient of thermal expansion, thermal conductivity, and other properties of a cured product thereof. The fillers are preferably particulate fillers.

Examples of such particulate fillers include aluminum hydroxide, magnesium hydroxide, kaolin, talcum, hydrotalcite, calcium silicate, beryllium oxide, boron nitride, solid glass powder, fumed silica, silica powder, zinc borate, aluminum nitride, silicon nitride, silicon carbide, carborundum, corundum, alumina, magnesium oxide, zirconium oxide, mullite, titanium oxide, potassium titanate, barium titanate, strontium titanate, wollastonite, beryllia, alumina trihydrate, magnesia, mica, talcs, nano-clays, and cenospheres as described in U.S. Pat. No. 8,187,696B2 (Paul et al.). In some embodiments, the fillers are surface treated with a silicon-containing coating. In some embodiments, a zirconate or titanate coupling agent is used to improve the dispersion of the filler in the polymeric matrix and to reduce water absorption.

The curable film can comprise a thermally conductive filler Examples of thermally conductive fillers include aluminum nitride, boron nitride, silicon carbide, diamond, nano-diamonds, graphite, beryllium oxide, zinc oxide, zirconium silicate, magnesia, silica, or alumina.

[Maleimide Resin]

Maleimide resins are common additives to curable thermosetting compositions. The most widely used maleimides include the bismaleimides (BMIs). BMIs are a class of maleimide-based resins that contain two maleimide groups in their molecular structure. They are known for their high reactivity towards amines and thiols, as well as their high thermal stability and good chemical resistance. They are widely used as co-monomers or resin additives in structural composites where high thermomechanical stability is desired. Common commercially produced BMIs include 4,4'-diphenylmethane bismaleimide, m-phenylene bismaleimide, m-phenylene bismaleimide, 2,2'-bis[4-(4-maleimidophenoxy)phenyl]propane, 3,3'-dimethyl-5,5'-diethyl-4,4'-diphenylmethane bismaleimide, 4-methyl-1,3-phenylene bismaleimide, and 1,6'-bismaleimide-(2,2,4-trimethyl) hexane, for example, under the trade names BMI-1000, BMI-1000H, BMI-1100, BMI-1100H, BMI-1100H, BMI-3000H, BMI-3000, BMI-4000, BMI-5100, BMI-7000H, BMI-7000, BMI-TMI manufactured by DKK (Japan).

Although there are thousands of known bismaleimides and hundreds of bismaleimides that are commercially available, only a very limited number of bismaleimides are suitable for incorporation into curable film compositions intended for use as dielectric film materials after they are cured. Indeed, a limited group of bismaleimides are commonly used as additives or base resins in curable film compositions intended for use as dielectric layers, dielectric adhesives, and FCCL layered applications after they are cured. Appropriate bismaleimides suitable for use as a co-curable resin in uncured dielectric compositions are well known to those skilled in the art, as taught, for example, in U.S. Pat. No. 10,822,527 (Tochihira et al.). In general, BMIs in uncured dielectric compositions are used to improve the properties of the cured product made therefrom. BMIs known to one skilled in the art to be useful for incorporation as resin additives or co-monomers in curable film compositions for making dielectric electronic materials have the following properties:

(1) BMIs that increase the adhesion of the composition and the peel strength of the cured product: It is important that BMIs selected for use in uncured compositions which will be used to make cured products in dielectric applications can increase the adhesion of the composition during the processing from uncured to cured product. This increased adhesion is important for the reliability of producing the cured product and also contributes to the peel strength of the cured product.

(2) BMIs that decrease the CTE of the cured product: One skilled in the art would be concerned that thermomechanical stress introduced by dissimilar CTEs of conducting layers (e.g., copper) and any insulating or dielectric layers would contribute to high failure rates during the thermal stress required to fabricate devices that depend on combining the dielectric and conducting layers. Thus, only BMIs with known thermal and dimensional stability within the range required to process curable compositions into cured products are believed to be useful as resin additives or co-monomers in uncured systems where thermal stress could render the cured product inoperable or unreliable.

(3) BMIs that increase the decomposition temperature of the cured product: BMIs useful in uncured layers intended for end use as cured products are required to survive the thermal stress of fabrication, solder-reflow or other surface-mount processes in addition to the thermal stress encountered during the cured product lifecycle. Only BMIs that have sufficient thermal stability, meaning that they can maintain their electrical and mechanical properties even at high temperatures, are useful.

(4) BMIs that have high Tg and can increase the Tg of the cured product: One of ordinary skill in the art would be concerned that the cured product resulting from the uncured composition intended for use as a dielectric layer would have to have a sufficiently high Tg (i.e., >200° C.). It is a fundamental teaching in the art of polymers suitable for dielectric material layers that a high (Tg) is required. Prior to the present invention, it has been a core teaching in the art of polymer materials science that a high Tg is important for dielectric materials to be used, for example, in PCBs, because it determines the thermal stability of the material. Tg is the temperature at which the material changes from a rigid, glassy state to a soft, rubbery state. In a PCB, for example, the dielectric material is subjected to elevated temperatures during soldering and assembly processes, as well as during normal use. If the Tg of the dielectric material is low, the material may soften and deform at these elevated temperatures, causing mechanical and electrical reliability issues. This can lead to problems such as delamination, cracking, loss of insulation resistance, and catastrophic failure. Thus, in the current state of the art, and excluding the teachings of the current invention, a high Tg dielectric material is believed to be necessary to ensure that the material maintains its mechanical and electrical properties at the temperatures encountered in PCB fabrication and use. A high Tg also enables the use of more aggressive assembly processes, such as reflow soldering, without compromising the reliability of the board. One skilled in the art would thus only consider BMIs with high Tg as suitable resin additives for incorporation into uncured compositions intended to be used to make cured dielectric films, cured dielectric layers, or other cured products where maintenance of the thermomechanical and electrical properties is required.

(5) BMIs that increase the Young's modulus of the cured product: The Young's modulus of a material is a measure of its stiffness or resistance to deformation under stress. It has been a core belief and fundamental teaching in the chemistry of polymers for use in dielectric layers that a high Young's modulus is desirable for cured dielectric products in multi-layer structures because it helps maintain the dimensional stability of the dielectric layers during fabrication and use. For example, when a PCB is subjected to thermal and mechanical stress during fabrication and use, the dielectric material is subjected to compressive and tensile forces. A high Young's modulus helps to ensure that the dielectric material does not deform excessively under these forces, which can lead to mechanical reliability issues such as cracking, delamination, loss of insulation resistance, and catastrophic failure. In addition, a high Young's modulus helps ensure that the dielectric material retains its thickness and dimensional stability during thermal cycles, which can affect the overall performance of the cured dielectric product in the end-use application. This is particularly important in HDI circuit boards, where the dielectric thickness is tightly controlled to allow for small, closely spaced electrical traces. Therefore, a high Young's modulus, prior to the current invention, is known to be required for dielectric layers, especially those for use in PCBs, because it helps maintain the mechanical stability and reliability of the board, and supports the use of high-density, high-performance designs. Thus, one of ordinary skill in the art would be led to select as resin additives or co-monomers for incorporation into uncured compositions only those BMIs which would increase or at least not decrease the Young's modulus of the cured product. This is especially true if the cured product was intended to be used in a PCB and even more so if the intended use of the cured product was a PCB using HDI designs.

(6) BMIs that have limited solubility in common organic solvents: It is well known in the art that BMIs suitable for use as co-monomers or resin additives in uncured thermosetting compositions intended to make cured products should have limited solubility in common organic solvents such as acetone, toluene, methylethyl ketone, and the like. It is also known that solubility in polar aprotic solvents, for example, N-methyl pyrrolidone, dimethyl acetamide, dimethyl formamdie, dimethylsulfoxide, and the like, is acceptable. In the case of using BMIs as co-monomers or resin additives in uncured compositions intended to make cured products in dielectric applications, low solubility in solvents is desirable because it ensures that the material retains its structural integrity and dimensional stability during processing and use. As is well known in the art, a low solubility also makes it easier to control the thickness and uniformity of the dielectric layer, which is important for achieving the desired electrical properties and performance. Additionally, a low solubility can help reduce the risk of contamination of the dielectric layer during processing, which can negatively impact the electrical performance of the device. In contrast, if the BMI is highly soluble, it may not be possible to control the thickness and uniformity of the layer, and the material may dissolve or become contaminated during processing, which can lead to reduced performance and reliability of the electronic device. High solubility in organic solvents, especially in aromatic solvents, is undesirable. Especially for uncured thermosetting compositions intended to make dielectric layers in electronic products, limited solubility in organic solvents is desirable because it helps ensure the stability and reliability of the composition before, during, and after cure due to, for example, minimal liberation of water generated from ring closing imidization during cure as described in U.S. Pat. No. 4,924,005 (Dahms). Organic solvents, such as alcohols and ketones, are commonly used in fabrication processes involving thermosetting dielectric layers, such as cleaning, solvent-based etching, and surface preparation. If the BMI has high solubility in these solvents, it can dissolve and degrade, leading to changes in the material properties of the uncured composition and the cured product resulting from the cure of the uncured composition. BMIs with high solubility in common organic solvents, when incorporated into uncured thermosetting compositions as co-monomers or resin additives, can lead to dimensional instability, inhomogeneous cure, poor adhesion, lowered peel strength, and degraded electrical performance including undesired alteration of Dk and Df. This can negatively impact the stability, reliability, and performance of the uncured composition, the process of curing, and the cured product resulting from the cure of the uncured composition. Undesirably high solubility can also render the curing process less predictable and less efficient. High solubility in organic solvents including acetone, ethanol, polar organic solvents or aromatic solvents, can also result in loss of adhesion between the cured product resulting from the uncured composition and other materials or layers in the end-use device, such as the substrate and metal traces of a PCB, which can result in delamination, mechanical unreliability, unpredictable thermomechanical properties, and degradation of electrical properties including undesired Dk and Df. Thus, it is commonly taught that only BMIs of limited solubility are suitable for use as co-monomers or resin additives in uncured thermosetting compositions to prevent dissolution, degradation, and loss of adhesion, and maintain the dimensional stability, electrical performance, and mechanical reliability of the cured product.

In summary, one of ordinary skill, who has followed the teaching of the existing art, would be led to select, for incorporation as co-monomers or resin additives into uncured thermosetting compositions intended for making dielectric layers after cure, only those BMIs that have: (1) ability to increase adhesion and peel strength of the cured product; (2) ability to decrease CTE of the cured product; (3) ability to increase decomposition temperature of the cured product; (4) ability to increase Tg of the cured product; (5) ability to increase Young's modulus of the cured product; and (6) low solubility in common organic solvents, such as acetone, toluene, methylethyl ketone, and the like, although high solubility in polar aprotic solvents, such as N-methyl pyrrolidone, dimethyl acetamide, dimethyl formamdie, dimethylsulfoxide, and the like, is acceptable. Thus, if choosing suitable co-monomers or resin additives for use in curable compositions where the cured product therefrom is intended for use as a dielectric film, one skilled in the art would assiduously avoid selection of any BMIs where the cured product would have a Tg less than 180° C.; a Young's modulus less than 0.5 GPa; a CTE greater than 70 ppm/° C.; and a high solubility in the common organic solvents, for example, solubility in toluene higher than 15 g/100 ml.

However, it has been found, contrary to the knowledge of a person of ordinary skill in the art, and in direct contradistinction to the teaching of, for example, U.S. Pat. No. 10,822,527 (Tochihira et al.), that the commonly used BMIs believed to be suitable for use in curable films to make dielectric layers, were unable to be incorporated into the curable film compositions of the present invention. The inventors have found that incorporation of the commonly used BMIs results in compositions which cannot be cured into films without introduction of voids, holes, defects, crystalline deposits, phase separations, or other imperfections, which renders the curable films inhomogeneous. For example, a curable film prepared using a composition containing diene rubber/liquid rubber and only 1 wt % of BMI 5100 resulted in phase separation or crystallization of the BMI within the film.

Surprisingly, it has been found that BMI resins, which are substantially soluble in toluene at concentrations of, for example, at least 10 g/100 ml, at least 15 g/100 ml, or even at least 20 g/100 mL, can be incorporated as resin additives or co-monomers into the curable film composition of the present invention that results in cured films without voids, defects, imperfections, phase separations, or irregularities in thickness.

The preferable maleimide resin to be incorporated into the curable film composition of the present invention is amorphous and has solubility in toluene of at least 5 g/100 ml, preferably, at least 10 g/100 ml, and more preferably, at least 15 g/100 ml, at ambient temperature. The curable films containing such maleimide resins demonstrate desirable high peel strength (e.g., >6 lb/in) on LP (low profile), VLP (very low profile), or HVLP (hyper very low profile) copper foil, ultra-low dielectric dissipation factor (Df) (e.g., <0.002, <0.0015, <0.0012, or even about 0.001), and low dielectric constant (Dk) ranging from about 1.9 to about 3.1. In an aspect, the maleimide resins used in the curable film of this invention possess good miscibility with diene rubbers and enable the creation of a curable film (e.g., Type-5 film) with excellent properties. For the purposes of simplicity, the maleimide resin used in the curable film composition of this invention is termed as "greasy MR" or "GMR." It is discovered that combinations of the diene-based rubber(s) and GMR(s) are useful to make suitable dielectric layers with low Tg and low modulus in a variety of applications, including for thermosetting PCB base materials, which is contrary to the prior art teaching, as described before and throughout this application.

In an embodiment, the GMR is co-curable with the diene-based rubber. In an embodiment, the GMR that is co-curable with the diene rubber has a solubility in toluene of greater than 10 g/100 ml at ambient temperature. In an embodiment, more than one GMRs are used.

The ratio of the diene rubber(s) to GMR(s) is not particularly limited, as the components have been found to typically have excellent compatibility with each other. However, the diene rubber to GMR ratio is preferably in the range of 1:0.1 to 1:2, and more preferably in the range of 1:0.2 to 1:0.8. In an embodiment, the diene rubber to GMR ratio ranges from about 1:2 to about 1:1. In an embodiment, the diene rubber to GMR ratio is greater than about 1:1, or greater than about 1:0.9, or greater than about 1:0.8, or greater than about 1:0.7, or greater than about 1:0.6. In another embodiment, the diene rubber to GMR ratio is greater than about 1:0.5, or greater than about 1:0.4, or greater than about 1:0.3, or greater than about 1:0.2.

Suitable maleimide resins for this invention contain unsaturation point that allow free radical curing or other curing methods and may be molecular, monomer, oligomer, polymer, and partially cross-linked in nature. Preferably, such maleimide resin contains two, or more than two, maleimide groups. It is discovered that a curable film that also comprises a GMR has improved adhesive, physical, thermal, and/or electrical properties.

In an embodiment, the GMR has a solubility in toluene of at least 5 g/100 ml at ambient temperature. In an embodiment, the GMR has a solubility in toluene of at least 10 g/100 ml, for example, greater than 20 g/100 ml, or greater than 30 g/100 ml, or greater than 40 g/100 ml. In an embodiment, the GMR has a solubility in toluene of greater than 40 wt/wt %, 50 wt/wt %, 60 wt/wt %, 70 wt/wt %, or 80 wt/wt % at ambient temperature.

In an embodiment, the GMR has a molecular weight of greater than about 600. In an embodiment, the GMR has a molecular weight of greater than about 1,000. In an embodiment, the GMR has a molecular weight of less than about 100,000. In an embodiment, the GMR has a molecular weight of greater than about 1,000 and a solubility in toluene of at least 10 g/100 ml at ambient temperature. In an embodiment, the GMR has a molecular weight of greater than about 1,000 and a solubility in toluene of at least 20 g/100 ml at ambient temperature.

The suitable GMR may have structures represented by the following formulae (3)-(5):

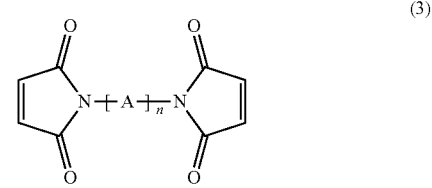

(3)

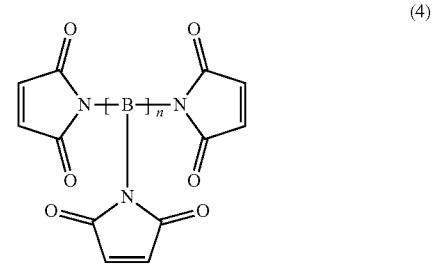

(4)

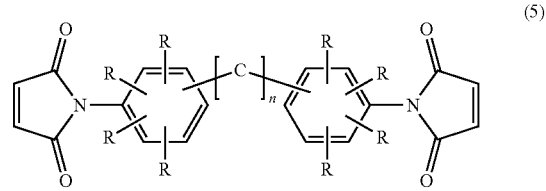

(5)

where n represents an integer of 1 to 100, and A, B, and C each represent a linking group that enables a solubility in toluene at ambient temperature of at least 5 g/100 ml or 10 g/100 ml. A specific but non-limiting example of formula 3 is GMI 2300 manufactured by Shin A T&C (Korea).

As it relates to the curable film, the exact molecular identity of the linking groups A, B and C in the formulae (3) to (5) is not particularly limiting. The presence of an aliphatic chain (e.g., containing 10 to 50 carbon atoms) typically leads to an appropriate solubility and help to ensure sufficient miscibility with the diene-based rubber. It is preferable that the linking groups do not contain an abundance of polar groups, since polar groups may cause the miscibility to deteriorate and/or lead to the dissipation factor of the film after curing to increase.

Specific but non-limiting examples of such suitable GMRs include those derived from dimer or trimer fatty acids and those derived from dimer or trimer fatty amines, such as $C_{36}$ amines. Specific but non-limiting GMRs derived from dimer fatty acids can be represented by the following formulae (6) to (8):

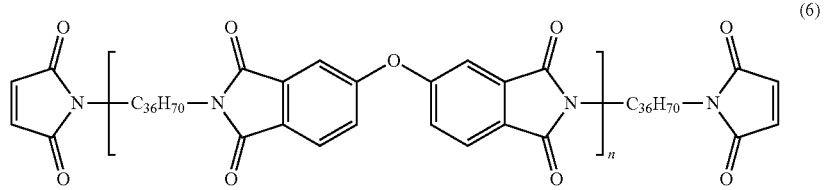

where in n=1 to 100;

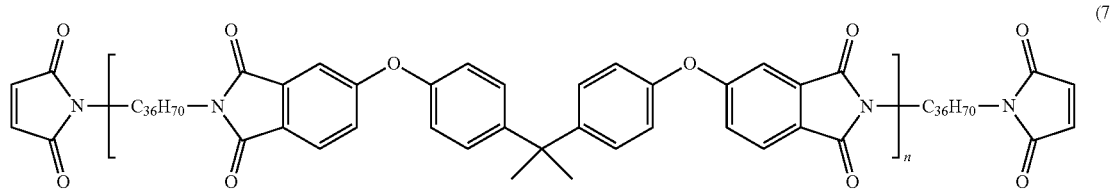

where in n=1 to 100; and

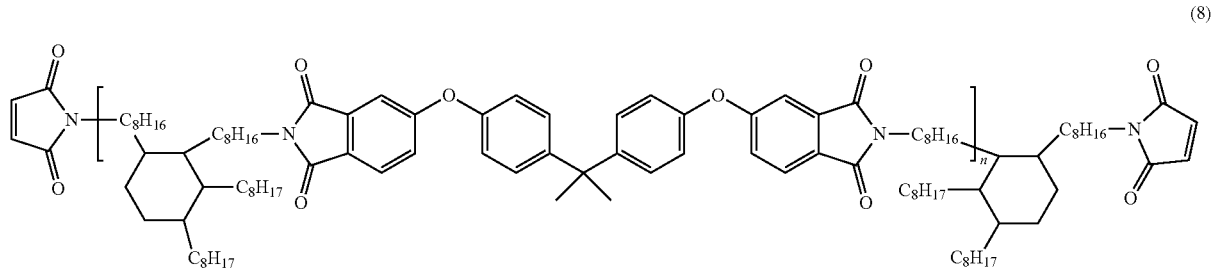

where in n=1 to 100.

Further incorporation of other BMIs into the curable film composition is possible as long as the incorporation does not serve to obviate the spirit of this invention.

[Other Additives]
<Flame Retardant>

To have fire or flame resistance, the curable film of the present invention or its cured product preferably also contains one or more flame retardants. In an embodiment, the curable film or its cured product may have a UL-94 rating of V0, V1, VTM-0, or VTM-1. The flame retardants may be added to the curable film in an amount of about 5 to 30 wt %, relative to the total weight of the curable film. For particulate flame retardants, particles that have a D50 of below 20 μm are preferred, below 10 μm are more preferred, and below 5 μm are even more preferred. The flame retardants may be surface modified to enhance compatibility with the other components of the curable film.

The flame retardants can be halogenated or non-halogenated; and non-halogenated flame retardants are preferred for environmental and health concerns. The non-halogenated flame retardants can be phosphorous-based or inorganic-based. Examples of phosphorus-based flame retardants include melamine polyphosphate, aluminum diethyl phosphonate, DOPO and DOPO derivatives including DOPO modified resins, triaryl phosphonates (e.g., triphenyl phosphate (TPP)), dimeric aryl phosphates (e.g., resorcinol bis(diarylphosphate), bisphenol A bis(diarylphosphate)), and phosphonate oligomers, homopolymers, and co-polymers. Commercially available phosphorous-based flame retardants include Exolit® OP935 or Exolit® OP945, aluminum polyphosphate available from Clariant Corporation, SPB100 or phosphazene available from Otsuka Chemical Corporation, Altexia from Albemarle, PQ 60 from Chin Yee Chemicals, and Nofia® OL series, CO series, and HM series of products available from FRX polymers (Chelmsford, MA USA). Examples of inorganic-based flame retardants include ATH (aluminum trihydroxide) and MDH (magnesium hydroxide). The inorganic-based flame retardants are usually coated with organic materials to improve their compatibility with the polymer matrix. Halogenated flame retardants such as Saytex 8010, ethylene-1,2-bis(pentabromophenyl) or BT 93 from Albemarle Corporation may also be used.

<Auxiliary Agents>

The curable film may comprise auxiliary agents that can be used to adjust the properties of the cured or uncured film. Such agents include antioxidants to promote the stability of the curable film or cured product thereof in field use, adhesion promoters to improve bonding to copper foils, compatibilization agents to improve the interaction between filler and rubber composition (B), and rheological modifiers to improve the flow characteristic of the curable film during heat pressing. Some auxiliary agents may server more than one purposes, for example, a reactive monomer or crosslinker may be used both to alter the rheological profile of the curable film and to alter the physical properties of the curable film in its cured form by, for example, increasing the modulus and decreasing the CTE.

The curable films can comprise other polymer such as a hydrocarbyl thermoplastic polymer or a styrene maleic anhydride. In an embodiment, the curable film can comprise a hydrocarbyl thermoplastic polymer comprising repeat units derived from an alpha-olefin and a $C_{4-30}$ cycloalkene; a reactive monomer that is free-radically crosslinkable to produce a crosslinked network; a free radical source; and a functionalized fused silica that is capable of chemically coupling to the crosslinked network. The hydrocarbyl thermoplastic polymer can comprise repeat units derived from at least one of cyclobutene, cyclopentene, cycloheptene, cyclooctene, cyclodecene, norbornene, and an alkyl- or aryl-substituted norbornene (such as 5-methyl-2-norbornene, 5-hexyl-2-norbornene, 5-phenyl-2-norbornene, 5-ethyl-2-norbornene, 4,5-dimethyl-2-norbornene, exo-1,4,4a,9,9a,10-hexahydro-9,10(1',2')-benzeno-1,4-methanoanthracene, exo-dihydrodicyclopentadiene, and endo,exo-tetracyclododecene). A molar ratio of the $C_{4-30}$ cycloalkene repeat units to the alpha-olefin repeat units to can be 6:1 to 0.5:1, or 6:1 to 1.5:1.0. An average molecular weight of the hydrocarbyl thermoplastic polymer can be 500 to 105,000.

In one embodiment, co-curable auxiliary agents with molecular weights greater than 500 are useful as additives to the curable film compositions of the present invention provided that they are soluble in toluene at levels of at least 10 g of the agent in 100 ml toluene at ambient temperature. Examples of such auxiliary agents include co-curable polyphenylene ethers such as SA9000, the co-curable vinyl-modified maleimide described in U.S. Pat. No. 11,066,520 (Hsieh), and co-curable poly(styrene-co-glycidyl methacrylate).

The curable film can comprise a reactive monomer or reactive crosslinker containing one or more unsaturated groups (e.g., vinyl-based, alkene-based, acetylene-based, acrylate-based, cyanate-ester based, modified maleimide based, and methacrylate-based). The use of a reactive monomer or crosslinker may serve the purpose of rheological modifier for the curable film and may simultaneously modify the modulus, thermal expansion properties, and/or electrical properties of the cured form of the curable film. The reactive monomer can comprise a triallyl (iso)cyanurate. The reactive monomer may be only composed of carbon and hydrogen. The reactive monomer can be styrenic. The reactive monomer may comprise a crosslinkable elastomer and can be a hydrocarbon resin diluent.

The crosslinkable elastomer can be derived from at least one of an olefin (for example, a $C_{2-8}$ alkene such as ethene, propene, butene, butadiene, piperylene, and isoprene) and a cyclic olefin (for example, a norbornene-type monomer comprising an unsaturated side group such as 5-vinyl-2-norbornene), with the proviso that the crosslinkable elastomer comprises at least one of an unsaturation in the backbone and an unsaturated side group. An example of a crosslinkable elastomer is one derived from ethene, propene, and dicyclopentadiene. If the curable film comprises the crosslinkable elastomer comprising repeating units derived from the cyclic olefin, it can be distinguished from the hydrocarbyl thermoplastic polymer in that the hydrocarbyl thermoplastic polymer can be free of a crosslinkable group or the crosslinkable elastomer can have a lower weight average molecular weight. For example, the crosslinkable elastomer can have a weight average molecular weight of 500 to 50,000, or 500 to 10,000, or 200 to 2,500; and the hydrocarbyl thermoplastic polymer can have a weight average molecular weight of 70,000 to 105,000. An example of a crosslinkable ethene-propene-dicyclopentadiene elastomer is TRILENE™ 65D commercially available from Lion Elastomers, Geismar, La.

The curable film can comprise a hydrocarbon resin diluent. The curable film can comprise 0 to 50 vol %, or 5 to 40 vol %, or 10 to 30 vol % of the hydrocarbon resin diluent based on the total volume of the curable film. The addition of the hydrocarbon resin diluent can result in at least one of a reduced minimum melt viscosity, an enhanced resin flow, and an improved leveling.

The hydrocarbon resin diluent can be saturated. The hydrocarbon resin diluent can comprise an amorphous thermoplastic oligomer or polymer produced by the polymerization of unsaturated hydrocarbons. As used herein, the hydrocarbon resin diluent oligomer can have a weight average molecular weight of less than or equal to 2,500.

The hydrocarbon resin diluent can comprise a $C_{2-9}$ hydrocarbon resin diluent. The hydrocarbon resin diluent can be derived from at least one of an aliphatic $C_{2-9}$ hydrocarbon or an aromatic $C_{6-9}$ hydrocarbon. The hydrocarbon resin diluent can be free of repeating units derived from a $C_{5-25}$ cycloalkene. The hydrocarbon resin diluent can comprise a repeating unit derived from a cyclooctene.

The hydrocarbon resin diluent can comprise a polybutene or an oligomeric polybutene. Oligomers of $C_4$ olefins (primarily isobutene) are commercially available in a wide range of weight average molecular weights. Short chain-length polybutenes are free-flowing; medium chain-length polybutenes are sticky with a honey-like consistency, while those with the longest chain length are tacky semi-solids. Examples of polybutenes include INDOPOL™ commercially available from INEOS Oligomers, London; and PANALANE™ commercially available from Vantage Specialty Ingredients, Inc., Warren, N.J.

The hydrocarbon resin diluent can be derived from piperylene and optionally an aromatic repeating unit. The hydrocarbon resin diluent can comprise a $C_5$ hydrocarbon resin diluent that can be prepared from at least one of piperylene or its derivatives such as cis/trans 1,3-pentadiene, 2-methyl-2-butene, cyclopentene, cyclopentadiene (CPD), and dicyclopentadiene (DCPD). Piperylene monomers and derivatives thereof can be cationically polymerized using Lewis acid catalysts to produce oligomeric resins with low-to-high softening points. The $C_5$ hydrocarbon resin diluent can be primarily aliphatic and can therefore be compatible with at least one of natural rubber, styrene-isoprene-styrene (SIS) copolymer, amorphous polyolefin (APO) (for example, amorphous polyalpha-olefin (APAO)), polyolefin (such as low-density polyethylene (LDPE)), synthetic elastomers, and low polarity cyclic-olefin-copolymers (COC). The $C_5$ hydrocarbon resin diluent can have a weight average molecular weights of 200 to 2,500. The $C_5$ hydrocarbon resin diluent can have a softening point of 85 to 115° C. (solid grades) or 5 to 10° C. (liquid grades). The $C_5$ hydrocarbon resin diluent can be hydrogenated to reduce discoloration and improve thermal oxidative and UV stability. Examples of $C_5$ hydrocarbon resin diluents include WINGTACK™ 10, WINGTACK™ 95, and WINGTACK™ 98 commercially available from Cray Valley, Exton, Pa.

The hydrocarbon resin diluent can comprise a $C_{8-9}$ hydrocarbon resin diluent, for example, an aromatic repeating unit. The $C_{8-9}$ hydrocarbon resin diluent can be prepared from coal tar or crude oil distillates, for example, indene, methylindene, styrene, methylstyrene (for example, alpha-methyl styrene), and vinyl toluene. The aromatic $C_{8-9}$ hydrocarbon monomer can be cationically polymerized using Lewis acid catalysts to produce oligomeric resins ranging in weight average molecular weight Compared to $C_5$ hydrocarbon resin diluents, aromatic $C_{8-9}$ hydrocarbon resin diluents can have higher melt viscosities and softening points (100 to 150° C.). Aromatic $C_{8-9}$ hydrocarbon resin diluents are also compatible with a variety of polymers.

The hydrocarbon resin diluent can comprise both the $C_5$ resin diluent and the $C_{8-9}$ hydrocarbon resin diluent, for example, as a blend or a co-oligomer or a copolymer thereof. Curable films of $C_5$ and $C_{8-9}$ hydrocarbon resin diluents (for example, as a blend or a copolymer) can comprise 0 to 50 wt % or 1 to 50 wt %, or 5 to 25 wt % of aromatic repeat units based on the total weight of the diluents. Examples of aromatic $C_{8-9}$ modified $C_5$ hydrocarbon resin diluents are Wingtack™STS, Wingtack™Extra, and Wingtack™86, commercially available from Cray Valley.

The hydrocarbon resin diluent can comprise a blend or co-oligomer or copolymer of any of the disclosed hydrocarbon resin diluents. For example, the hydrocarbon resin diluent can comprise a co-oligomer or copolymer derived from petroleum-based feedstocks, such as aliphatic $C_5$, aromatic $C_9$, styrene, ethylene, propylene, and butadiene. The hydrocarbon resin diluent can comprise at least one of a styrene-ethylene butadiene-styrene copolymer or styrene-propylene butadiene-styrene copolymer, which can optionally be hydrogenated. An example of such a hydrocarbon resin diluent is REGALREZ™ resins commercially available from Eastman.

The hydrocarbon resin diluent can be distinguished from the hydrocarbyl thermoplastic polymer in that at least one of the following applies: 1) the diluent can have a lower weight average molecular weight, for example, a weight average molecular weight of the diluent can be less than or equal to 60% of the weight average molecular weight of the hydrocarbyl thermoplastic polymer: 2) the diluent can have a lower heat deformation temperature point; 3) the diluent can have a lower glass transition temperature; and 4) the diluent can be reactive. One or more of these distinguishing features can enable the hydrocarbon resin diluent to have a plasticizing effect on the hydrocarbyl thermoplastic polymer and ceramic-filled versions thereof, thereby enhancing resin flow and reducing the minimum melt viscosity for the formulated system.

The hydrocarbon resin diluent can have a weight average molecular weight of 200 to 2,500, or 1,000 to 2,200, or 1,000 to 8,000. The hydrocarbon resin diluent can have a number average molecular weight of 150 to 6,000, or 200 to 2,200.

Other auxiliary agents that can be included into the curable film include colorants (e.g., dyes and pigments), plasticizers, cure retardants, cure accelerators, impact modifiers, UV protectors, heat stabilizers, light stabilizers, radical stabilizer, anti-static agents, preservatives, toughening agents, rubber particles, lubricants, mold releasers, blowing agents, fungicides, processing aids, acid scavengers, nucleating agents, nanotubes, wetting agents, dispersing agents, synergists, reinforcing agents, whiskers, and smoke suppressants.

[Method of Manufacturing the Curable Film]

A method for preparing the curable film of the present invention is described below. In some embodiments, the curable film is provided on a substrate. A suitable substrate can be a plastic film, a metal foil, a paper, a woven fabric, a nonwoven fabric, or the like, optionally having one surface or both surfaces subjected to a release treatment.

Methods of making the curable films described herein include solvent casting, melt extrusion, lamination, and coating methods. Non-limiting examples of solvent casting, melt extrusion, lamination, and coating methods can be found, for example, in U.S. Patent Application Publication Nos. US 2005/0133953, US 2009/0050842, US 2009/0054638, US 2009/0096962, and US 2010/0055356, the contents of which are incorporated herein by reference. Further examples of solvent casting, melt extrusion, lamination, and coating methods to form films can be found, for example, in U.S. Pat. Nos. 4,592,885 and 7,172,713, the contents of which are also incorporated herein by reference.

Although in some embodiments it may be possible to manufacture the curable films in a solvent-free process (e.g., melt extrusion), continuous solvent cast process (e.g., coating process) is the preferred method for preparing the curable dielectric films described herein, because the solvent casting process can provide a film having high quality and uniform thickness.

The curable film according to the present invention may be prepared by coating a varnish composition onto a substrate, such as a carrier film and a copper foil, followed by drying to remove the volatile solvent. The varnish composition, in which the components of the curable film composition are dispersed in a solvent, is essentially a precursor to the curable film. Suitable solvents include, but are not limited to, toluene, 1,3 dioxolane, ethyl acetate, and any mixtures thereof. In some embodiments, the varnish composition is stable (i.e., before the varnish gels due to the curing of certain composition components) for days. In some embodiments, the varnish composition is stable for weeks, months, or years before gelling occurs.

Examples of a method for coating include ordinary coating methods and printing methods. Specific examples of coating methods may include air doctor coating, bar coating, blade coating, knife coating, reverse coating, transfer roll coating, gravure roll coating, kiss coating, cast coating, spray coating, slot die coating, calendar coating, dam coating, dip coating, and die coating. Specific example of printing methods may include intaglio printings such as gravure printing, and stencil printings such as screen printing.

Although drying conditions for removing the solvent are not particularly limited, it is preferable that the drying is conducted at a temperature appropriately adjusted depending on the solvent used in the varnish composition within a range of 60 to 150° C. Drying temperature of lower than 60° C. is usually not preferable, because the solvent tends to remain in the film. In addition, low drying temperature coupled with the volatilization of the solvent may cause dew condensation and phase separation or precipitation of the resin component. Drying for prolonged time and at elevated temperature, especially those of higher than 150° C., is also not preferable, because premature curing of the film may occur.

A typical solvent casting process involves steps of (1) dissolving and/or dispersing the components (e.g., rubber, fillers, initiator, and other components such as flame retardant, other organic polymers, oligomers, and molecules) in a solvent to create a varnish; (2) coating the varnish on a substrate; and (3) evaporating/removing the solvent via drying (e.g., drying with a drying oven) to yield a film on the substrate. The final thickness of the film can be controlled, for example, by passing the varnish through a slot die. Typically, for the casting process to yield a high-quality film, it is important that the polymer and other organic-based components dissolve in the varnish solvent, and the filler components are well-dispersed. The residence time and temperature profile of the drying oven will dictate factors such as the amount of residual solvent retained in the film and whether the film is partially cured or cured into a cross-linked polymer composition, or if the composition remains as an admixture (e.g., still has thermoplastic qualities). In some embodiments, the composition is a thermoplastic polymer composition after the film casting and drying process. In some embodiments, the composition is a thermosetting polymer composition after the film casting and drying process. In some other embodiments, the polymer composition is a crosslinked thermoplastic composition after the film casting and drying process.

In some embodiments, the curable film is manufactured on or provided on a substrate, such as a metal (e.g., copper, aluminum) foil, a disposable plastic carrier or release film, or other common carrier or release liners. Unlimited examples of preferable plastic carrier or release films include a polyethylene film, a polypropylene film, a polymethylpentene film, a polyethylene terephthalate (PET) film, a fluoropolymer film, a polyethylene-coated paper, a polypropylene-coated paper, and a silicone releasable paper. The carrier or release film may be treated with a release coating on one side or both sides. In the case of a releasable substrate utilizing a plastic film as a base material, the thickness of the plastic film is preferably about 10 to 100 µm; whilst in the case of the releasable substrate utilizing a paper as a base material, the thickness of the release paper is preferably about 50 to 200 µm in some embodiments, the curable film manufactured on such carrier or release film may be further laminated. In some embodiments, the curable film manufactured on such carrier or release film may be further laminated with another release film or release paper as, for example, a protective layer so that both sides of the curable film are in contact with a releasable carrier film. The carrier or release films can later be removed, and the curable film can be revealed and used.

In some embodiments, the curable film is coated directly on a metal foil, such as a copper or an aluminum foil. Preferably, the copper foil is about 3 to 35 µm thick. The roughness of the copper foil may be standard HTE (High-Tensile Elongation) "shiny", LP (Low Profile), VLP (Very Low Profile), HVLP (Hyper Very Low Profile), or ANP (Almost No Profile). The metal foil may be treated with adhesion promoter such as a silane coupling agent. In some embodiments, the curable film is coated directly on a copper foil, and then a protective carrier or release film is laminated thereon. In some embodiments, the curable films can be coated with a 0.5-5.0 µm thick sputtered copper through, for example, a physical vapor deposition process. In some embodiments, laminates are made by laminating copper foils coated with the curable films of the present invention, followed by pressing them together through hot roll lamination of pressing using batch processing with a platen press.

In some embodiments, the curable film is tack-free to the touch. In some embodiments, the curable film is a Type-4 or Type-5 film that possesses sufficient plasticity such that it can be peeled off the carrier film and placed on an object, which can be a copper foil or sheet, a copper clad (etched, partially etched, or no etch), or copper unclad fiberglass core. In some embodiments, an assembly is formed, in which the curable film (e.g., Type-3 film) on a carrier film is placed on a substrate on its free surface side (i.e., the side opposite the side of the curable film that contacts the carrier film); the assembly is passed through a roll laminator; and then the carrier film is peeled away leaving the curable film on the new substrate, which can be a copper foil or sheet, a coper clad (etched, partially etched, or no etch), or copper unclad fiberglass core.

In some embodiments, the curable film is metal (e.g., copper) clad or unclad. In some embodiments, the curable film is unreinforced (e.g., not comprising woven or nonwoven glass fabric or organic fabric).

[Properties of the Curable Film and a Cured Product Obtained from Curing the Curable Film]

Here, "a cured product obtained from curing the curable film" can be a cured film obtained by curing the curable film of the present invention or any product containing the curable film after it is partially or fully cured. In some embodiments, the curable film and the cured product obtained from curing the curable film are substantially isotropic. In some embodiments, all of the Component (B) constituents in the curable film and the cured film obtained therefrom are substantially miscible. The thickness of the curable films or the cured films obtained therefrom typically ranges from about 0.2 Mil to about 16 Mil (i.e., about 5 µm to about 400 µm), preferably from about 0.4 Mil to about 10 Mil (i.e., about 10 µm to about 250 µm), and more preferably about 0.5 mil to 4 mil (i.e., about 12 µm to about 100 µm). In some embodiments, the thickness is approximately 10 µm, 12.5 µm, 15 µm, 20 µm, 25 µm, 30 µm, 40 µm, or 45 µm. In some embodiments, the thickness is approximately 50 µm, 55 µm, 60 µm, 65 µm, 70 µm, 75 µm, 80 µm, 85 µm, 90 µm, 95 µm, 100 µm, or 105 µm. In some embodiments, the thickness is from about 100 µm to about 200 µm. In some embodiments, the curable films can be stacked to achieve a thickness of about 2 Mil to about 10 Mil, or about 11 Mil to about 60 Mil.

The curable film can have a minimum melt viscosity of from about 1,000 Pa·s to about 1,000,000 Pa·s as determined by rheometry at 0.1% strain. In some embodiments, the curable film can have a minimum melt viscosity of from about 1,000 Pa·s to about 100,000 Pa·s as determined by rheometry at 0.1% strain. In some embodiments, the curable film can have a minimum melt viscosity of from about 2,000 Pa·s to about 10,000 Pa·s as determined by rheometry at 0.1% strain. In some embodiments, the curable film can have a minimum melt viscosity of from about 5,000 Pa·s to about 20,000 Pa·s as determined by rheometry at 0.1% strain. In some embodiments, the curable film can have a minimum melt viscosity of from about 20,000 Pa·s to about 80,000 Pa·s as determined by rheometry at 0.1% strain. In some embodiments, the curable film can have a minimum melt viscosity of from about 80,000 Pa·s to about 200,000 Pa·s as determined by rheometry at 0.1% strain. In some embodiments, the curable film can have a minimum melt viscosity of from about 200,000 Pa·s to about 1,000,000 Pa·s as determined by rheometry at 0.1% strain. In some embodiments, minimum melt viscosity occurs from about 80° C. to about 200° C., or from about 80° C. to about 160° C., or 100° C. to about 150° C. as determined by rheometry at 0.1% strain.

In some embodiments, the curable film is a Type-3 film; in some embodiments, the curable film is a Type-4 film; and in some other embodiments, the curable film is a Type-5 film. In some embodiments, the curable film formed on a carrier film can be laminated or heat pressed with the carrier film still on, and the carrier film is then removed to reveal the curable film or the cured film obtained therefrom to be disposed on a new substrate. In some embodiments, the free surface of the curable film, which is a surface opposite to the surface contacting the carrier film, contacts a new substrate and the thus-formed assembly of the new substrate and the curable film on the carrier film is passed through a roll laminator, the curable film can then be transferred from the carrier film to the new substrate. In some embodiments, the curable film can be removed from the carrier or release film and placed on a substrate. In some embodiments, the curable film is tack-free to the touch. In some embodiments, the curable film possesses sufficient plasticity such that it is a Type-5 film and can be peeled off the carrier film, and then manipulated and placed on another object.

The curable films of the present invention have an outstanding long shelf life. Currently available curable dielectric films tend to have limited shelf life due to factors such as moisture absorption, chemical degradation, and aging. Many curable dielectric materials have a high affinity for water and can absorb moisture from the air over time. This can lead to changes in the electrical properties of the material, such as a decrease in insulation resistance and an increase in dielectric constant. Moisture in the curable film can also cause blistering during lamination with copper; and cause the curable film material to swell or delaminate from the substrate, which can lead to electrical failure. Curable films for making dielectric materials can also be chemically degraded by exposure to light, heat, or other environmental factors. Curable films are highly susceptible to chemical degradation over time especially when stored above refrigerated temperatures. Chemical degradation can result in changes to the material's electrical properties, such as changes in dielectric strength and an increase in dielectric loss; and can cause dielectric material to become brittle, which can lead to cracking and significant degradation of electrical and thermomechanical properties over time. In addition, dielectric films can undergo aging, which is a time-dependent and temperature-dependent change in the material's properties. Aging can occur due to exposure to environmental factors, such as heat and radiation, or due to the intrinsic properties of the material. As dielectric material films age, their electrical properties can change, which can lead to reduced performance and eventual failure. In the case of curable films for making dielectric layers, aging can cause the uncured films to cure over time which can alter the rheological, electrical, and thermomechanical properties of the curable film.

Because of these reasons, in order to enable a shelf life of up to 180 days, commercially available curable films and curable prepregs require refrigerated storage at a temperature of 5C or lower. In addition, commercially available curable films typically require refrigerated storage with humidity control in metallized bags to enable a shelf life of at least 90 days or 3 months. In contrast, the curable films of the present invention are able to achieve a shelf life of more than 90 days at ambient temperature without humidity control. Some embodiments have a shelf life of at least 6 months, at least 12 months, or at least 18 months even when stored at ambient temperatures within metallized bags or without metallized bags, with or without controlled humidity conditions.

The cured product obtained from curing the curable film of the present invention may have a peel strength of at least 2.2 lb/in on multiple grades of copper foil, including Standard HTE (high-tensile elongation) "shiny" copper with tooth size >7 microns; LP (low profile) copper foils with tooth sizes 5.1-9.9 microns; VLP (very low profile) copper foils with tooth size >2 microns and <5 microns; HVLP (hyper-very low-profile) copper foils with tooth size >0.5 microns and <2 microns and ANP (Almost No Profile) copper with tooth size <0.5 microns. In some embodiments, the cured product has a peel strength of from about 3 to 10 lb/in on LP 1 oz copper. In some embodiments, the cured product has a peel strength of from about 2.2 to 5 lb/in on ANP 1 oz copper. In some embodiments, the cured product has a peel strength of from about 4 to 10.5 lb/in on "shiny" 1 oz copper. In some other embodiments, the cured product has a peel strength of from about 2.9 to 9 lb/in on VLP 1 oz copper. In some other embodiments, the cured product has a peel strength of from about 2.6 to 8.5 lb/in on HVLP 1 oz copper.

The Young's modulus of the curable film or the cured product obtained from curing the curable film ranges from about 0.01 GPa to about 10 GPa, preferably from 0.01 GPa to 6 GPa, more preferably from 0.01 GPa to 2 GPa, and even more preferably from 0.01 GPa to 1 GPa. In some embodiments, the Young's modulus of the cured product is about 0.05 GPa, 0.1 GPa, 0.15 GPa, 0.2 GPa, 0.25 GPa, 0.3 GPa, 0.35 GPa, 0.4 GPa, or 0.45 GPa. In some embodiments, the Young's modulus of the cured product is about 0.5 GPa, 0.55 GPa, 0.6 GPa, 0.65 GPa, 0.7 GPa, 0.75 GPa, 0.8 GPa, 0.85 GPa, 0.9 GPa, or 0.95 GPa. In some embodiments, the Young's modulus of the cured product is from about 1 GPa to about 2 GPa. In some embodiments, the Young's modulus of the cured product is from about 2 GPa to about 3 GPa. In some embodiments, the Young's modulus of the cured product is from about 3 GPa to about 4 GPa. In some embodiments, the Young's modulus of the cured product is from about 4 GPa to about 10 GPa.

The glass transition temperature (Tg) of the cured product obtained from curing the curable film can range from about $-75°$ C. to about 200° C. as determined by a thermomechanical analysis (TMA). Preferably, the cured product has a Tg of approximately $-75°$ C. to 150° C. as determined by TMA. In some embodiments, Tg of the cured product ranges from about $-75°$ C. to about 30° C. as determined by TMA. In some embodiments, Tg of the cured product ranges from about 0° C. to about 150° C. as determined by TMA. In some other embodiments, Tg of the cured product ranges from about 0° C. to about 100° C. as determined by TMA.

In some embodiments, the cured product obtained from curing the curable film has a thermal conductivity larger than 0.3 W/mk. In some embodiments, both the curable film and the cured product obtained from curing the curable film have a substantially isotropic coefficients of thermal expansion (CTE) when unclad. The cured product may have an average CTE ranging from about 10 to 400 ppm/° C. in the temperature range of 25° C. to 260° C. In some embodiments, the cured product has an average CTE of about 10 to 35 ppm/° C. in the temperature range of 25° C. to 260° C. In some embodiments, the cured product has an average CTE of about 10 to 60 ppm/° C. in the temperature range of 25° C. to 260° C. In some embodiments, the cured product has an average CTE of about 60 to 100 ppm/° C. in the temperature range of 25° C. to 260° C. In some embodiments, the cured product has an average CTE of about 100 to 200 ppm/° C. in the temperature range of 25° C. to 260° C. In some embodiments, the cured product has an average CTE of about 100 to 150 ppm/° C. in the temperature range of 25° C. to 260° C. In some other embodiments, the cured product has an average CTE of about 150 to 250 ppm/° C. in the temperature range of 25° C. to 260° C.

In some embodiments, the cured product obtained from curing the curable film has a dielectric constant (Dk) measured at 10 GHz of less than 3.5, preferably from about 1.7 to about 3.2. In some embodiments, the cured product has a Dk measured at 10 GHz of about 2.5 to 3.2. In some embodiments, the cured product has a Dk measured at 10 GHz of about 2.85 to 3.2. In some embodiments, the cured product has a Dk measured at 10 GHz of less than about 2.45. In some embodiments, the cured product has a Dk measured at 10 GHz of about 1.7 to 2.2. In some other embodiments, the cured product has a Dk measured at 10 GHz of about 1.8 to 2.45.

In some embodiments, the cured product obtained from curing the curable film has a dielectric dissipation factor (Df) measured at 10 GHz of less than 0.005. In some embodiments, the cured product has a Df measured at 10 GHz of about 0.004, 0.0035, 0.0033, 0.0030, 0.0028, 0.0026, or 0.0025. In some embodiments, the cured product has a Df measured at 10 GHz of about 0.0024 to about 0.0020. In some embodiments, the cured product has a Df measured at 10 GHz of about 0.0020 to about 0.0008. In some embodiments, the cured product has a Df measured at 10 GHz of about 0.0018 to about 0.0008. In some embodiments, the cured product has a Df measured at 10 GHz of about 0.0015 to about 0.0008. In some other embodiments, the cured product has a Df measured at 10 GHz of about 0.0014 to about 0.0008.

[Printed Circuit Boards (PCBs)]

Also provided is a PCB comprising one or more dielectric layers obtained from the curable films described herein.

There are two major failure modes for vias in PCBs: (1) overstress and (2) low cycle fatigue. Overstress can manifest itself during the reflow process where the temperature of the assembly is typically about 250° C. Multiple passes are generally required for the reflow and a combination of overstress and cyclic fatigue can cause failure of the micro-vias. The second failure mode is low cycle fatigue (less than 1,000-10,000 cycles) caused by the service conditions, which may, in extreme cases, vary from −55° C. to 135° C. It is believed that, in both failure modes, the key driver of poor reliability is the differential in coefficient of thermal expansion (CTE) between the metal (typically, copper) conductor and the materials used for dielectric layers. Failure due to the differential thermomechanical properties of the constituent materials of a PCB or IC substrate package can be manifested in a number of ways, including cracks at copper interconnects (i.e., in the plated through holes and vias) and voids from delamination. All these failure modes are derived from the stress placed on the interconnects that arises from the thermomechanical strain mismatch between copper conducting layers and dielectric insulating layers.

It has been widely taught for decades, accepted as a core teaching of the prior art and well-known by a person of ordinary skill in the art of PCB design and PCB materials science, that PCB reliability is only achievable if constructed from dielectric base materials with CTEs that are as low as possible, with the aim of matching the CTE of copper (approximately 17 ppm/° C.), through the range of temperature from the ambient temperature to the reflow or assembly temperature (typically around 250 to 260° C.). It is similarly taught and accepted as fundamental knowledge by those skilled in the art that a higher Young's modulus (i.e., a more rigid material) is also required to minimize the thermomechanical stress that occurs between the copper conducting layer and the adjacent dielectric layers during the PCB fabrication process and throughout the PCB product lifecycle. As CTE and Young's modulus are correlated, PCB base materials that yield a low CTE also have a relatively high Young's modulus. The requirement that suitable PCB base materials require a low CTE close to or matching the CTE of copper and a high Young's modulus to minimize the mechanical stress induced by CTE mismatch during the manufacture, processing, and life-cycle required for PCBs has been a fundamental, persistent, and unchallenged teaching from the inception of the PCB industry. Dielectric materials suitable for use in PCB assemblies are thus required to have low CTE as close as possible to the CTE of copper to minimize mechanical stress caused by mismatched expansion, to have high modulus to resist the mechanical stress that is caused by the thermal expansion, and to have high glass-transition temperatures (Tg) to ensure that the dielectric material can survive the PCB fabrication process and ensuing device lifecycle without the catastrophic failure induced by the abrupt change in thermomechanical properties that occurs above the Tg. These are the fundamental teachings of PCB material design, core tenants of the knowledge base of those skilled in the art, and inviolable design rules of suitable PCB dielectric materials selection and development. These rules are particularly important for HDI PCB structures where the inner connections between the conducting layers of the PCB are even more fragile and even more susceptible to disruption during fabrication and throughout the HDI PCB lifecycle. The fragility of these inner connections, which are called micro-vias, have led to further restrictions on acceptable dielectric materials and more restrictive design rules for HDI PCBs. For example, prior to the current invention, it has been well known to those skilled in the art that PCB designs that employ stacked micro-vias positioned directly above buried micro-vias are not suitably reliable and must be avoided. Similarly, multi-layer HDI PCBs with greater than 2-4 layers cannot be reliably produced with any previously known dielectric materials that survive both fabrication and post-fabrication thermal cycling test conditions.

In contradistinction to this well-known body of knowledge, the inventors have discovered that although, in some embodiments, the dielectric layer of the present invention has low Tg, low modulus, and/or high CTE, such dielectric layer can surprisingly be suitable for use in the fabrication of reliable PCBs. Even more surprisingly, the inventors have found that previously unachievable PCB structures can in fact be fabricated by using dielectric materials of the present invention which are designed and fabricated in complete contradiction to conventional, accepted dielectric materials design requirements. That is, contrary to the conventional teaching in PCB material design, reliable PCBs can be constructed from dielectric materials with thermomechanical properties outside the conventionally accepted characteristics limits. The dielectric layer of the present invention is found to be particularly useful in manufacturing multi-layer PCBs and HDI PCBs to achieve higher reliability and to enable increased interconnect density. In some embodiments of the present invention, the dielectric layers enable the use of stacked vias which can survive assembly and have a high fatigue life under the operating conditions. In one particularly surprising example, an embodiment of the present invention was used to produce an HDI PCB structure with 4 layers of stacked micro-vias stacked directly on top of a buried via. The HDI PCB as constructed with an embodiment of the present invention survived pre-conditioning for fabrication with 6× reflow at 260° C. The same HDI PCB structure then survived over 100 cycles of thermal stress cycling between room temperature and 160° C. without disruption of the inner connections between the conducting layers. Such highly complicated arrangement of stacked multi-layer micro-vias directly over and on top of a buried micro-via cannot reliably be achieved with any other conventional PCB dielectric material. Nor can any currently available dielectric material be reliably incorporated into a multi-layer HDI PCB structure of more than 4 layers without suffering substantial disruption of conducting layer inner connections during pre-conditioning, fabrication, and post-fabrication thermal cycling as described above.

Characteristics that make the dielectric layer of the present invention ideal for PCBs, in particular, multilayer PCBs and HDI PCBs, include low Dk and/or low Df and/or low skew in combinations that were previously unachievable in dielectric layers configured as base layers in PCBs, the ability to reach a dielectric thicknesses below 50 µm, improved dielectric spacing, enhanced adhesion to materials including metals such as copper, increased micro-via reliability, and lower insertion loss due to the combination of ultra-low Dk and low Df (e.g., <0.0012, <0.0015, <0.002, or <0.003). In addition, because the dielectric layer of the present invention is a homogeneous and isotropic film, the weave effect, which especially plagues the woven fabric reinforced composites and causes skew or timing issues in high-speed digital transmission over PCBs, can be eliminated.

HDI PCBs that are used for IoT devices, camera modules, infotainment systems, mobile phones, tablets, and other consumer devices in addition to chip packaging, standard double and single sided boards, motherboards, sequential lamination boards, high and standard layer count boards, and flexible boards, would greatly benefit from the use of this new material. Further, potential improvement in lasability and increased throughput due to the absence of glass fibers, ability to break the dielectric thickness barrier, a potential 20-30% thickness reduction in boards, weight reduction for PCBs, capability to decrease stresses on copper plated vias, reduced Z expansion increasing micro-via reliability, and improved crack resistance due to thickness control, are some additional benefits that can be expected from the new material of the present invention.

Having generally described the invention, a further understanding can be obtained by reference to certain specific examples provided hereinafter for purposes of illustrations only. These examples are not intended to be limiting.

EXAMPLES

[Preparation of Curable Films]

Examples of curable film were generally prepared by compounding and uniformly dispersing the components of the curable film composition (see Tables 1 and 2 for various curable film compositions of the comparative and inventive examples described herein) in a suitable solvent (toluene, or ethyl acetate, or 1,3 dioxalane, or any mixture thereof) in a high-speed rotary mixer to produce a varnish; followed by applying the varnish with a bar onto a carrier film to obtain an assembly; and subsequently drying the assembly in a drying oven to a level of <1% retained solvent. Depending on the bar height, a curable film having a thickness of about 0.5-4 Mil could be obtained.

For preparing curable films for PCBs, a varnish was first prepared by compounding and dispersing the components of the curable film composition in a suitable solvent (toluene, or ethyl acetate, or 1,3 dioxalane, or any mixture thereof) using a Cowles mixer or high viscosity propellor. The solvent also serves to adjust the viscosity of the final varnish to approximately 2,700 centipoise (cps) at 22° C. Subsequently, the varnish composition was continuously applied by a die coater on a 26" wide, 2 mil thick PET-based carrier film to create an assembly. The obtained assembly was then passed through a four-zone drying oven. The line speed and the zone temperatures of the drying oven were adjusted such that the residual solvent level in the product was about 1% or less. The product was wound on a roll and/or sheeted to a dimension of 18"×24". This procedure was particularly used to produce dielectric curable films on a carrier with a thickness of 3.5 mil, 2 mil, 1.2 mil, or 1.0 mil; and may be adjusted to produce other curable films.

For property testing purposes, piles of the curable films were stacked together to build up thickness for electrical and thermomechanical testing and consolidated using hydraulic platen press by curing at a temperature of 160-250° C. for about 1 to 4 hours. Dielectric constant (Dk) and dissipation factor (Df) at 10 GHz were obtained with a split post dielectric resonator. The coefficients of thermal expansion (CTE (ppm/° C.)) were obtained using a thermomechanical analyzer (TMA) according to IPC-TM-650 2.4.24.5. The Young's modulus was measured at 30° C. using a dynamic mechanical analyzer (DMA). Glass transition temperatures (Tg (° C.)) were obtained using TMA. Values of peel strength (lb/in) presented in Table 1 were measured using 1 oz standard HTE "shiny" copper foil; and values of peel strength (lb/in) presented in Table 2 were measured using 1 oz HVLP copper foil.

E1-E13 as shown in Table 1 were inventive examples containing HGMs and diene rubbers ("DR") as the essential components of the curable film composition. Some of these examples also contained liquid rubbers ("LR"). C1-C5 were comparative examples. The weight percentage of HGM, DR, or LR for each example listed in the table was calculated based on the total weight of the curable film. Other curable film components as described in this disclosure made up for the balance.

All the inventive E1-E13 curable films were Type-5 films. They were tack-free to the touch and possessed sufficient plastic-like qualities such that they could be readily peeled off the disposable PET-based carrier and handled in a freestanding form. The cured product of E1-E13 curable films all had low Df and very-low or ultra-low Dk. In addition, the cured product of E1-E13 curable films had a Young's modulus ranging from about 0.1 GPa to 1.4 GPa and an average CTE in the temperature range of 25-260° C. from about 26 ppm/° C. up to <310 ppm/° C. Thus, as demonstrated by these examples, a broad range of mechanical, thermal, and electrical properties that are suitable as PCB dielectric materials can be achieved by specific combinations of HGM, diene rubber, and other components in the rubber composition (B) of the inventive curable film described herein.

TABLE 1

| | Curable Film Composition | | | | Film Properties | | | | | |
|---|---|---|---|---|---|---|---|---|---|---|
| | HGM | | | | Film | | | | | Peel |
| | wt % | D50 (μm) | DR | LR | Type | Dk | Df | CTE | Tg | Strength |
| E1 | 2.4 | 11 | 18.5 | 43.9 | 5 | 2.42 | 0.0020 | 307 | <150 | >3 |
| E2 | 4.8 | 11 | 18.4 | 43.9 | 5 | 2.37 | 0.0022 | 289 | <150 | >3 |
| E3 | 9.6 | 11 | 17.5 | 43.9 | 5 | 2.28 | 0.0024 | 211 | <150 | >3 |
| E4 | 10.0 | 11 | 18.2 | 43.9 | 5 | 2.23 | 0.0024 | 112 | <150 | >3 |
| E5 | 14.9 | 11 | 49.5 | 14.5 | 5 | 2.21 | 0.0026 | 95 | <150 | >3 |
| E6 | 11.8 | 18 | 58.8 | 17.7 | 5 | 2.24 | 0.0029 | 112 | <150 | >3 |
| E7 | 24.6 | 11 | 15.1 | 43.1 | 5 | 2.04 | 0.0037 | 77 | <150 | >3 |
| E8 | 26.2 | 11 | 16.1 | 45.9 | 5 | 2.01 | 0.0038 | 110 | <150 | >3 |
| E9 | 26.2 | 11 | 16.1 | 48.3 | 5 | 2.02 | 0.0035 | 101 | <150 | >3 |
| E10 | 35.4 | 11 | 13.0 | 37.1 | 5 | 1.96 | 0.0021 | 39 | <150 | 2.94 |
| E11 | 36.4 | 11 | 53.5 | 5.2 | 5 | 1.93 | 0.0035 | 40 | <150 | 2.6 |
| E12 | 37.2 | 11 | 54.7 | 0 | 5 | 1.93 | 0.0035 | 77 | <150 | 2.64 |
| E13 | 58.8 | 11 | 39.2 | 0 | 5 | 1.61 | 0.0036 | 26 | <150 | 0.80 |
| C1 | 0 | — | 18.7 | 56.7 | 5 | 2.48 | 0.0018 | 395 | <150 | >3 |
| C2 | 1.4 | 11 | 18 | 42 | 5 | 2.46 | 0.0022 | >310 | <150 | >3 |
| C3 | 1.8 | 11 | 22.4 | 43.9 | 5 | 2.48 | 0.0024 | >310 | <150 | >3 |
| C4 | 70.6 | 11 | 28.2 | 0 | 2 | ND | ND | ND | ND | ND |
| C5 | 74.3 | 11 | 24.8 | 0 | 2 | ND | ND | ND | ND | ND |

* ND = "not determined"

Comparative example C1 did not contain HGM or any other filler. Although a Type-5 curable film was obtained and the cured product had good enough dielectric properties (a low Dk of 2.48 and a low Df of 0.0018), it failed the PCB reliability testing described below and was thus unsuitable for use in the construction of rigid PCBs or as a build-up layer for making HDI PCBs.

Comparative examples C2 and C3 did not contain enough HGMs; and the cured products had CTE values exceeding 310 ppm/° C. Similar to comparative example C1, the cured products could not be used as reliable PCBs in that they could not survive pre-conditioning or even a single thermal press cycle required for PCB fabrication and they could not survive post-fabrication thermal stress cycling.

As demonstrated by comparative example C4 and C5, if the amount of HGMs in the curable film was too high (exceeding 70 wt %), although a substantially even and homogeneous curable film could be formed on carrier, it was only a Type-2 film in that it was not transferable or releasable and could not be removed from the carrier in its entirety. Indeed, the C4 and C5 curable films were brittle and crumbled.

E14-E26 as shown in Table 2 were inventive examples containing fillers (HGMs and/or fused silica), diene rubbers, and greasy maleimide resins (GMR) as the essential components of the curable film composition. The weight percentage of the fillers, the diene rubber, or the GMR was calculated based on the total weight of the curable film. Other curable film components as described in this disclosure made up for the balance.

As shown in Table 2, all the inventive E14-E26 curable films were Type-5 curable films with excellent electrical properties and peel strength even when measured using a less rough copper foil. These examples demonstrated that even at high filler loadings (e.g., >65 wt %) of HGMs and/or silica, Type-5 films could still be obtained. Example E16 demonstrated that a Df of <0.001 was achievable when, for example, the curable film also contained an extremely low Df hydrocarbon polymer or elastomers, such as an elastomer based on cyclic olefin co-polymer. Table 2 demonstrates that the combination of DR, GMR, HGM, and silica can be adjusted to tailor the Dk and/or Df properties whereby it is possible to create any Dk between about 1.8 and about 3.2.

TABLE 2

| | Curable Film Composition | | | | Film Properties | | |
|---|---|---|---|---|---|---|---|
| | | | Filler | | | | |
| | DR (wt %) | GMR (wt %) | HGM (wt %) | Fused silica (wt %) | Film type | Dk | Df | Peel strength |
| E14 | 18.1 | 9.1 | 0 | 72.5 | 5 | 3.16 | 0.0011 | >3 |
| E15 | 18.8 | 18.8 | 0 | 48.4 | 5 | 3.00 | 0.0019 | >3 |
| E16 | 22.1 | 9.9 | 0 | 49.7 | 5 | 2.87 | 0.0009 | >3 |
| E17 | 22.1 | 11 | 0 | 66.2 | 5 | 3.09 | 0.0015 | >6 |
| E18 | 24.8 | 12.4 | 0 | 62.2 | 5 | 3.00 | 0.0010 | >6 |
| E19 | 30.3 | 15.15 | 45.5 | 0 | 5 | 1.80 | 0.0035 | >2 |
| E20 | 33.5 | 23.9 | 26.8 | 0 | 5 | 1.94 | 0.0034 | >3 |
| E21 | 35.9 | 35.9 | 26.8 | 0 | 5 | 1.98 | 0.0029 | >3 |
| E22 | 43.9 | 23.9 | 32.9 | 0 | 5 | 1.99 | 0.0037 | >6 |
| E23 | 47.9 | 23.9 | 26.8 | 0 | 5 | 2.03 | 0.0033 | >8 |
| E24 | 54.6 | 27.2 | 16.4 | 0 | 5 | 2.18 | 0.0023 | >3 |
| E25 | 27.5 | 12.1 | 12.1 | 48.4 | 5 | 2.47 | 0.0023 | >3 |
| E26 | 38.0 | 19.0 | 11.4 | 30.4 | 5 | 2.38 | 0.0020 | >3 |

[Manufacture of Multilayer PCBs]

Figure 2:
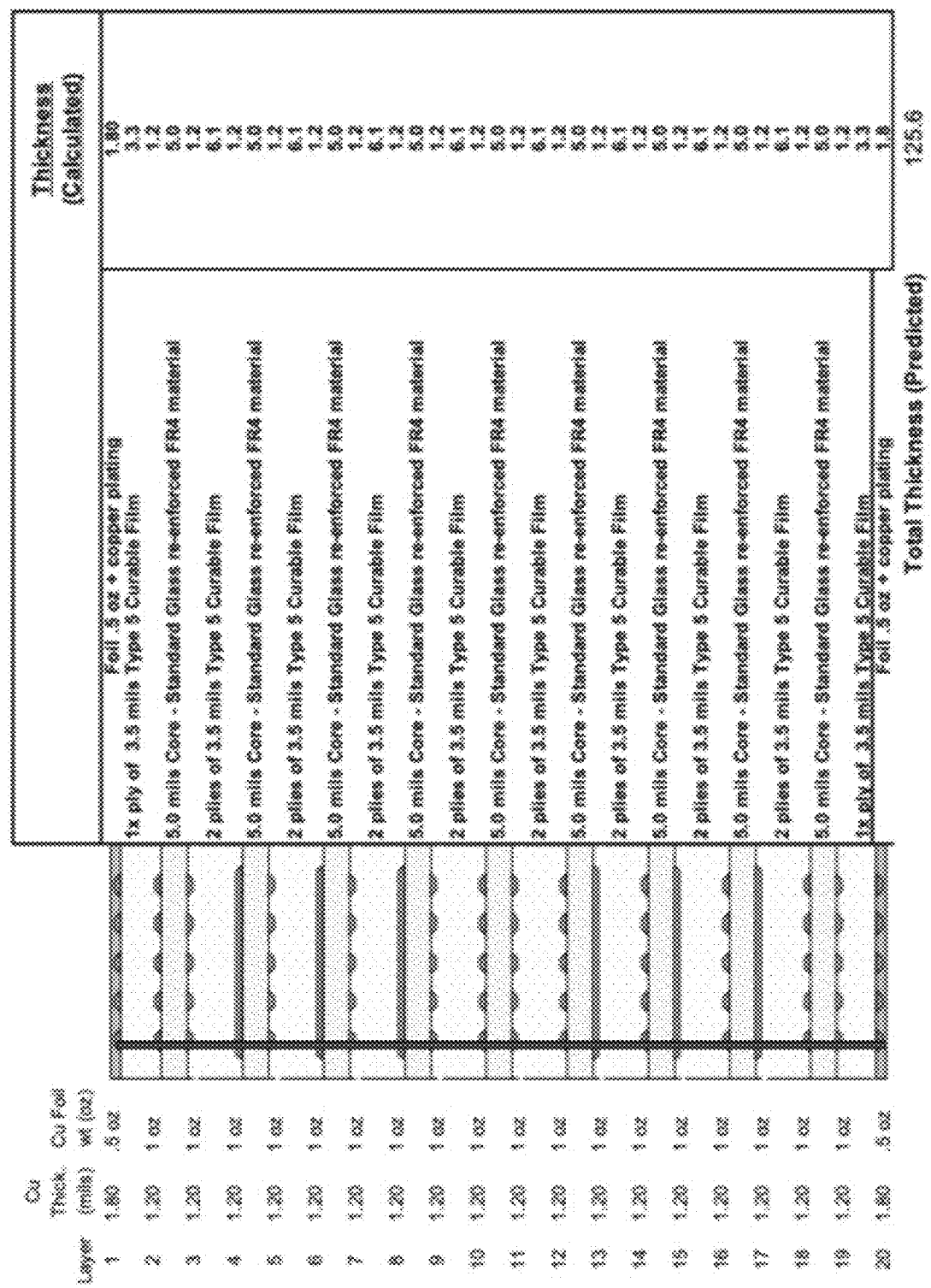
FIG. 2 illustrates a 20-layered PCB stack-up structure used in the examples described herein, where Type-5 curable film instead of prepreg layer is used as the bonding layer.

Twenty-layered hybrid PCBs, using curable films instead of prepreg layers as the bonding layers between copper foils, were built with the basic stack-up structure detailed in FIG. 2. The PCBs were constructed using 5.0 mils standard FR4 (fiberglass reinforced dielectric) material, 1.0 oz copper foils as inner copper layers, and curable films each with a thickness of about 3.5 Mil. The curable film was used as the bonding layer, in lieu of the commonly used glass reinforced prepreg layer. The PCB panel had the common panel size dimension of 18"×24" for high volume production. Each inner copper layer was chemically etched to create the desired copper features and then chemically treated, using standard PCB process, to prepare the copper surface for lamination.

The PCB was laminated in a vacuum press under pre-defined conditions suitable for curing the curable films. Typically, the material was exposed to a full vacuum during the entire press cycle that reached a temperature of about 210° C. for a total time of about 3 hours under a pressure of up to 400 PSI.

The 20-layered hybrid PCB was then mechanically drilled, the holes cleaned and plated, the outer layer circuitry etched, and the PCB was finished with a solder mask. The individual PCB boards were then routed out to yield the finished boards. Sections were taken from the finished PCB and subjected to thermal stress and evaluation according to IPC-TM-650 2.6.8.

<Inventive Multilayer PCB>

Figure 3:
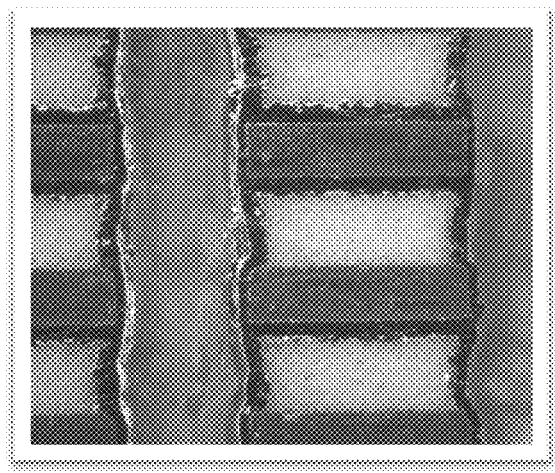
FIG. 3 shows the optical cross-section after thermal stress of a section of a 20-layered PCB having a structure as illustrated in FIG. 2, where the inventive Type-5 curable film E9 is used as the bonding layer.

In this inventive example, the curable film E9 in Table 1 was used as the curable film in the 20-layered hybrid PCB. As shown in FIG. 3, the PCB passed the thermal stress test, and there were no voids or other signs of thermal stress.

<Comparative Multilayer PCB>

Figure 4:
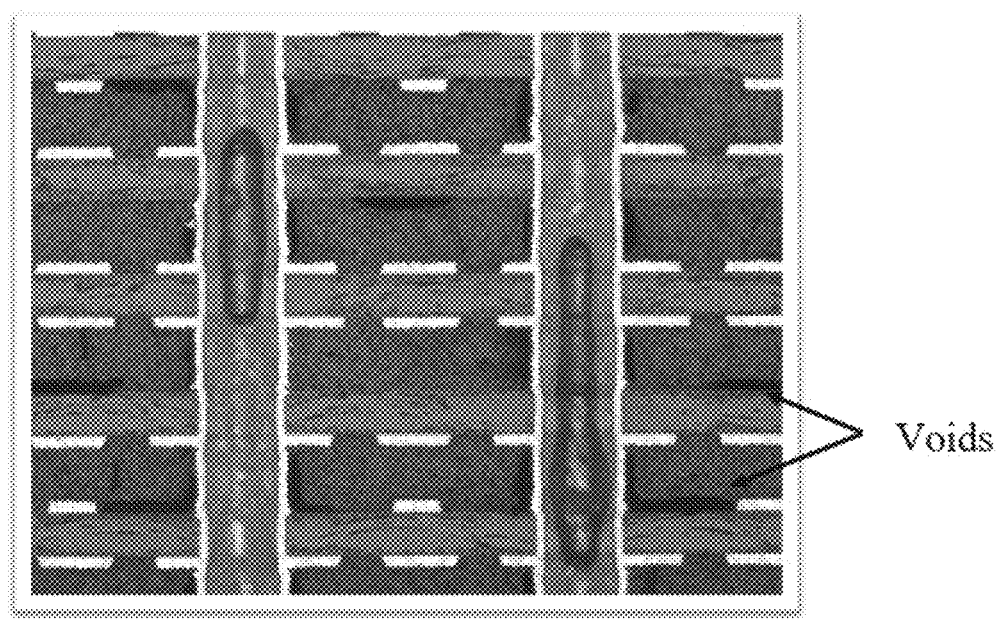
FIG. 4 shows the optical cross-section after thermal stress of a section of a 20-layered PCB having a structure as illustrated in FIG. 2, where a comparative curable film C1 is used as the bonding layer.

In this comparative example, the curable film C1 in Table 1 was used as the curable film in the 20-layered hybrid PCB. As shown in FIG. 4, the PCB failed the thermal stress test in that voids appeared after thermal stress at the interlayers derived from the curable film C1, which was devoid of HGM or silica filler.

[Manufacture of Multilayer HDI PCB]

Figure 5:
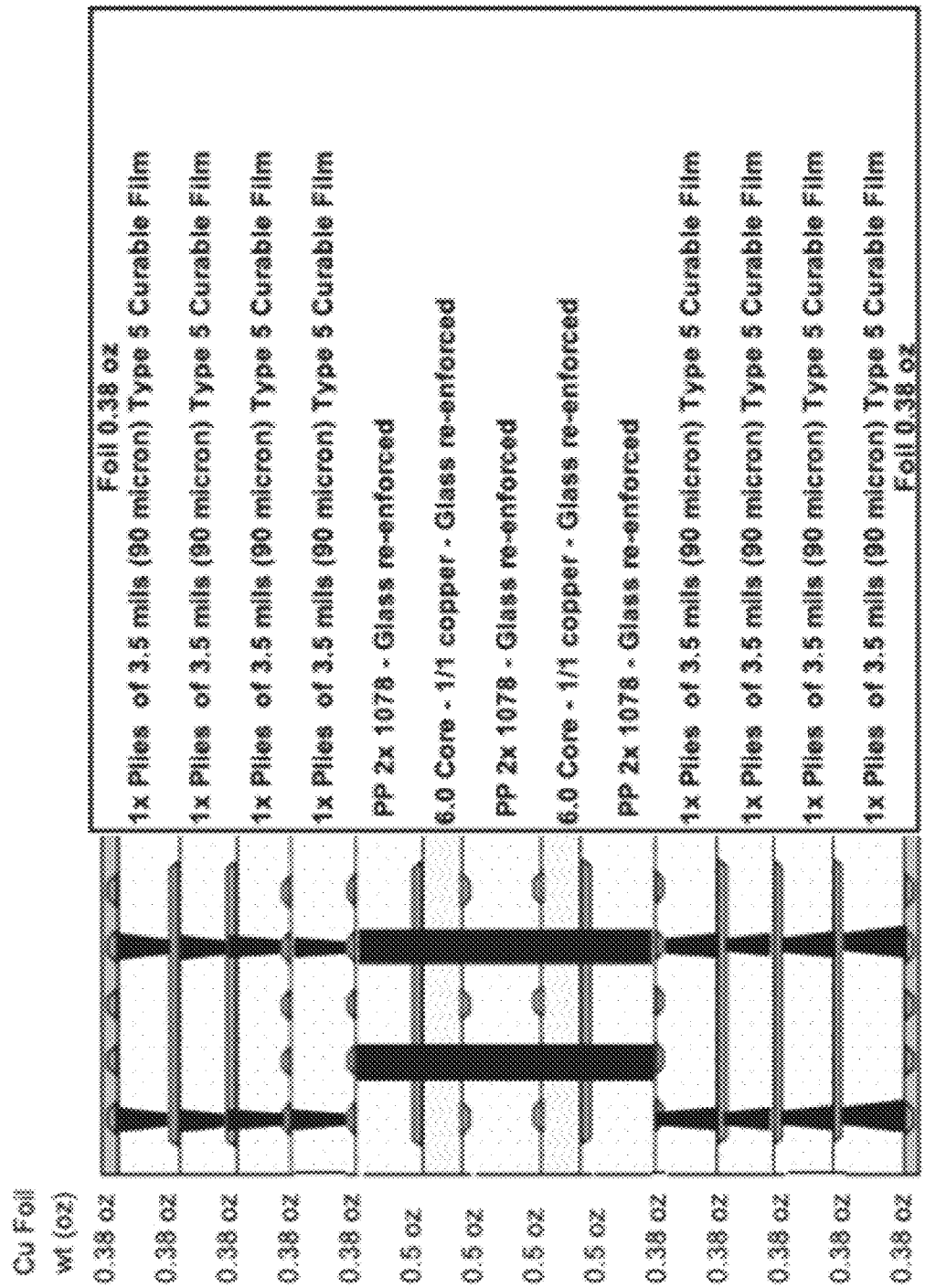
FIG. 5 illustrates a 4+6+4 HDI PCB stack-up structure where the middle section layers are glass reinforced prepreg-based layers and the four build-up layers are derived from the inventive Type-5 curable film E9.

A 4+6+4 HDI PCB with micro-vias stacked and offset from the buried via holes was fabricated via a lamination process. The detailed stack-up structure is shown in FIG. 5. The middle section layers were glass reinforced high-Tg FR4 material; and, in this example, 4 layers of the curable film E9 in Table 1, each having a thickness of about 3.5 mils, were added via the sequential lamination process on either side of the middle section. The HDI PCB was fabricated in a similar manner as the multilayer PCBs described above with the exception that a laser process was used to form the micro-via cavities.

The type of micro-via structures where the micro-vias are fabricated directly on top of the buried via is known as "unreliable" as it is exceptionally fragile with respect to thermal disruptions during fabrication and thermal stress testing. Thus, such design is taught against and discouraged by PCB industry associations including the IPC and the HDP as there are no suitable conventional dielectric materials which can be incorporated into multilayer HDI PCBs using this type of design. However, there is a need in the industry for such structures, because if these stacked-on-buried arrangements could be reliably incorporated into multilayer HDI PCBs, it would enable new classes of multilayer HDI PCB architectures.

Figure 6:
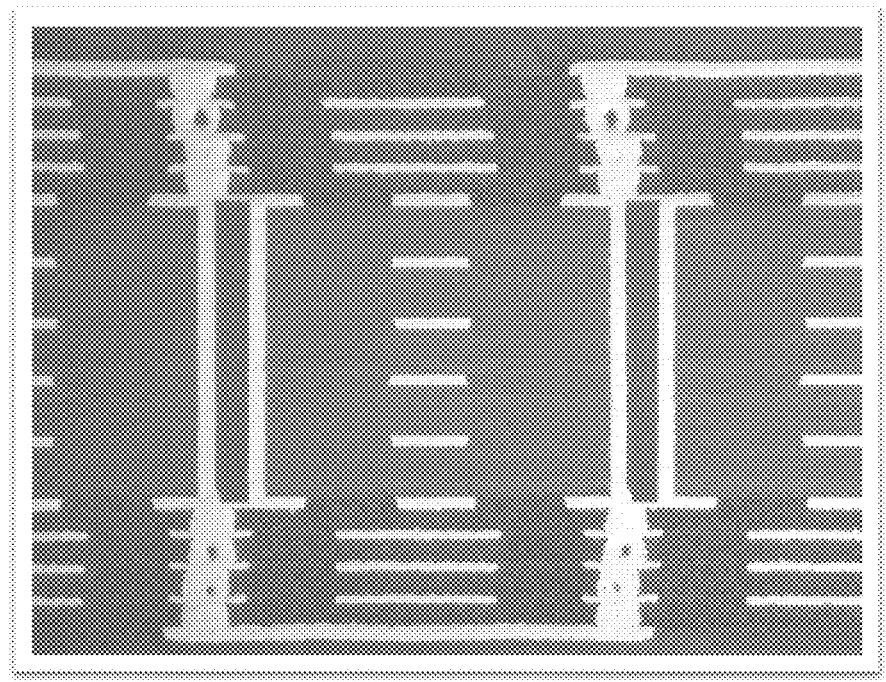
FIG. 6 shows the optical cross-section of the 4+6+4 HDI PCB of FIG. 5 after thermal stress and 100 cycles to 160° C.
Figure 7A:
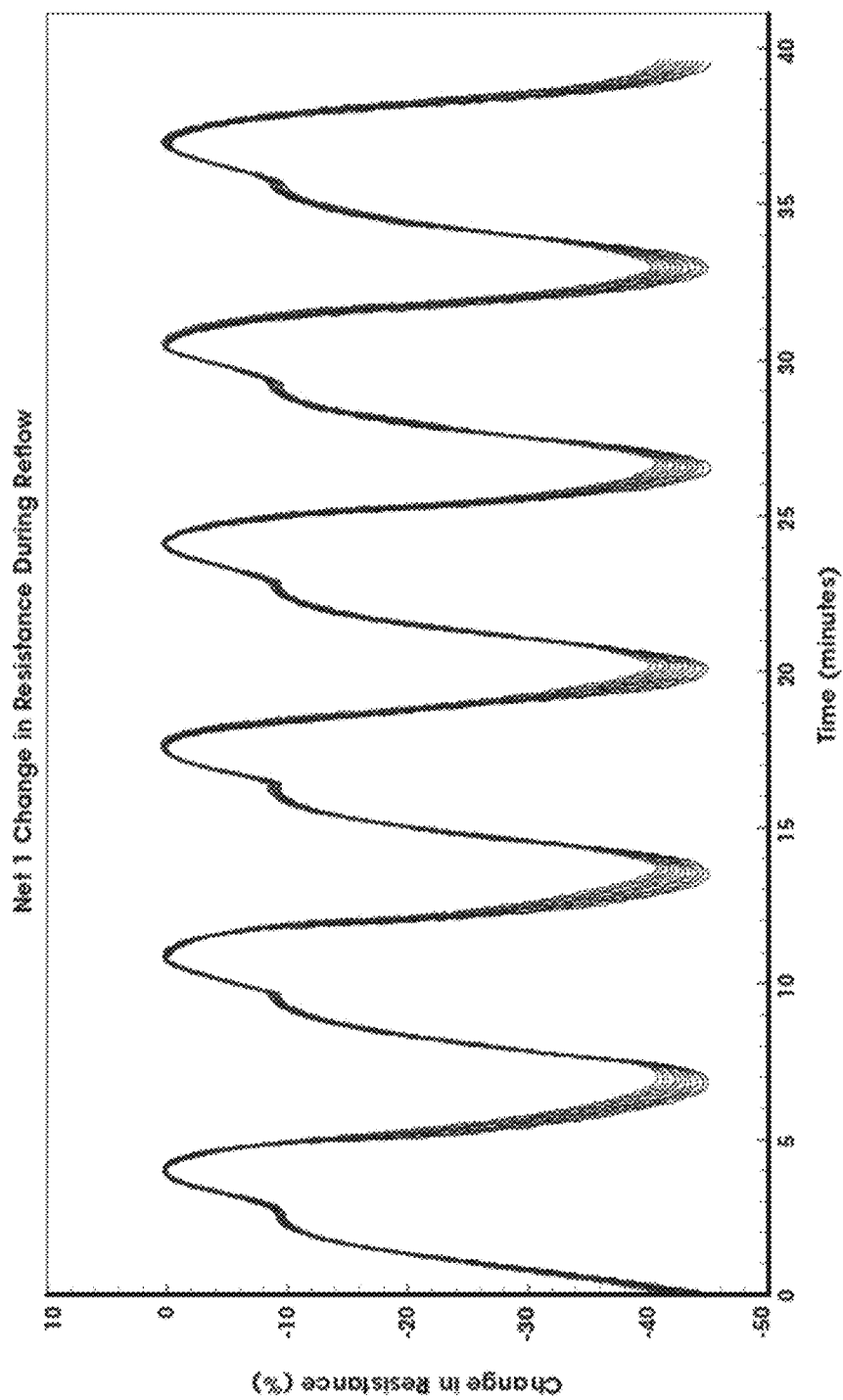
FIG. 7A shows the change in electrical resistance of the 4+6+4 HDI PCB of FIG. 5 during reflow measured in accordance with IPC-TM-650, METHOD 2.6.7.2.
Figure 7B:
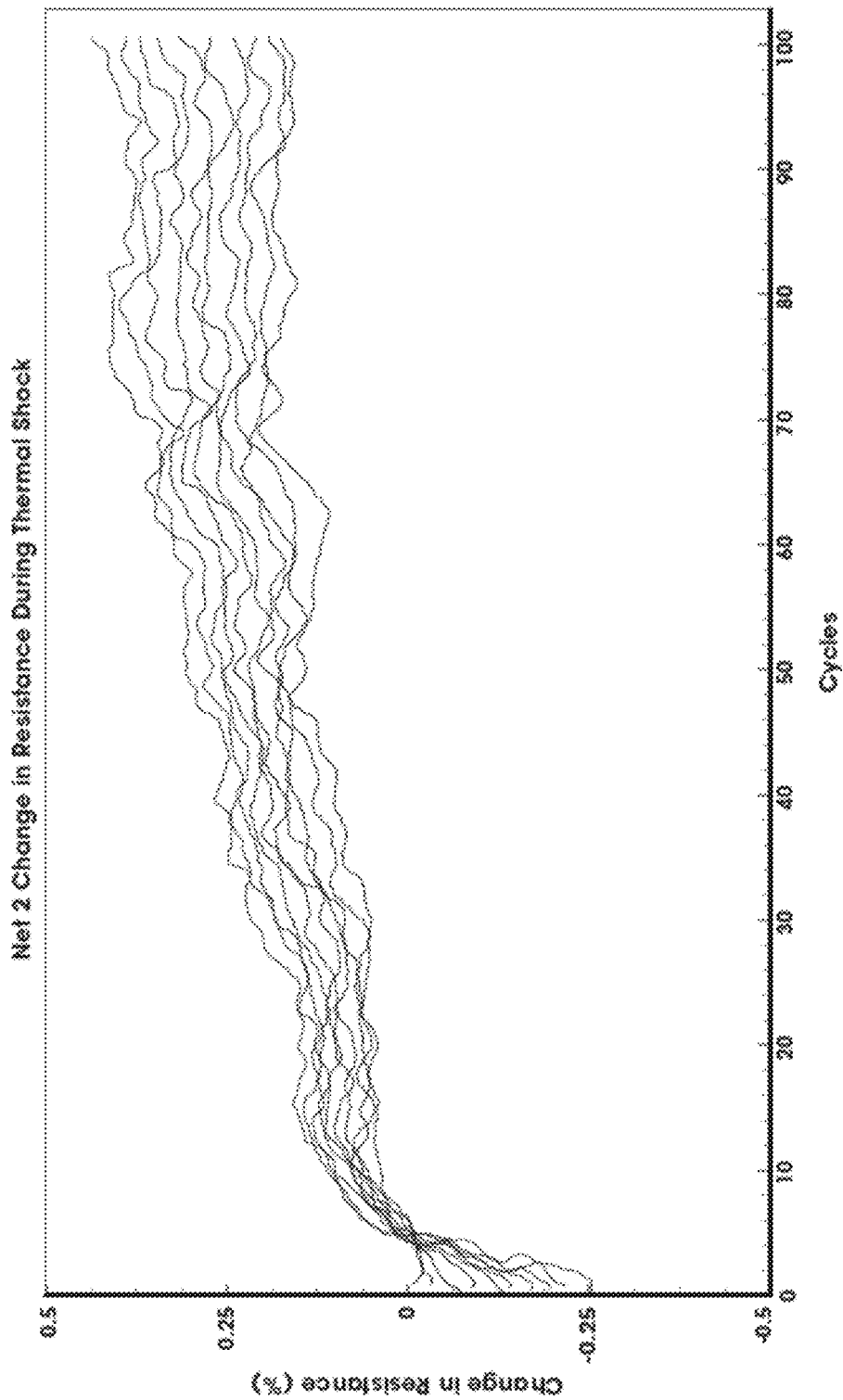
FIG. 7B shows the change in electrical resistance of the 4+6+4 HDI PCB of FIG. 5 during thermal shock cycling measured in accordance with IPC-TM-650, METHOD 2.6.7.2.

As highlighted in the optical cross-section shown in FIG. 6 and the electrical testing results shown in FIGS. 7A and 7B, the 4+6+4 HDI PCB of this example successfully passed the standard industry tests for evaluation of HDI PCB reliability. The HDI PCB constructed using the curable film of the present invention passed the stringent micro-via accelerated test that consisted of 6× reflow precondition at 260° C. and also passed the post-fabrication thermal reliability standard of greater than 100 thermal stress cycles from room-temperature to 160° C. while constantly monitoring the electrical resistance of the structure. In particular, all variances—micro-via directly on top of the buried via holes or slightly offset by, for example, about 3.0 mils to 8.0 mils from the center line of the buried via holes but still on top of the buried vias—met the IPC-TM-650, METHOD 2.6.7.2 requirement of 5% maximum resistance change as demonstrated in FIGS. 7A and 7B.

The above written description of the invention provides a manner and process of making and using it such that any person of ordinary skill in the relevant art is enabled to make and use the same, this enablement being provided in particular for the subject matter of the appended claims, which make up a part of the original description. This description is provided in the context of a particular application and its requirements. Various modifications to the embodiments will be readily apparent to those of ordinary skill in the relevant art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. In this regard, certain embodiments within the invention may not show every benefit of the invention, considered broadly.

The invention claimed is:

1. A curable film, comprising:
   (A) hollow glass microspheres having D50 of equal to or less than 12 μm; and
   (B) a rubber composition containing at least one diene-based rubber.

2. A curable film, comprising:
   (A) hollow glass microspheres, which have D50 of equal to or less than 19.5 μm and are not subjected to an acid or alkaline wash before incorporation into the curable film; and
   (B) a rubber composition containing at least one diene-based rubber.

3. The curable film of claim 1, wherein a content of the hollow glass microspheres ranges from about 2 wt % to about 65 wt %, relative to a total weight of the curable film.

4. The curable film of claim 1, wherein the rubber composition further contains at least one liquid rubber.

5. The curable film of claim 4, wherein a weight ratio of the at least one diene-based rubber to the at least one liquid rubber ranges from about 1:5 to about 1:0.1.

6. The curable film of claim 1, wherein the rubber composition further contains at least one poly(arylene ether).

7. The curable film of claim 1, wherein the rubber composition further contains one or more initiators and/or curing agents.

8. The curable film of claim 1, wherein the rubber composition further contains one or more flame retardants.

9. The curable film of claim 1, having a thickness ranging from 10 μm to 400 μm.

10. The curable film of claim 1, having a shelf life of greater than 90 days at ambient temperatures.

11. A cured film, obtained by curing the curable film of claim 1.

12. The cured film of claim 11, having a glass transition temperature of less than 150° C.

13. A cured film obtained by curing a curable film comprising:
   (A) hollow glass microspheres having D50 of equal to or less than 19.5 μm; and
   (B) a rubber composition containing at least one diene-based rubber,
   wherein the cured film has a dielectric constant at 10 GHz of less than 2.45.

14. An assembly, comprising:
   a substrate, and
   the curable film of claim 1 on the substrate.

15. A cured product, obtained by curing the assembly of claim 14.

16. A printed circuit board, comprising: a dielectric layer obtained by curing the curable film of claim 1.

17. The curable film of claim 2, having a shelf life of greater than 90 days at ambient temperatures.

18. The curable film of claim 2, wherein a content of the hollow glass microspheres ranges from about 2 wt % to about 65 wt %, relative to a total weight of the curable film.

19. An assembly, comprising:
a substrate, and
the curable film of claim 2 on the substrate.

20. A cured product, obtained by curing the assembly of claim 19.

21. A printed circuit board, comprising: a dielectric layer obtained by curing the curable film of claim 2.

* * * * *